United States Patent
Wu et al.

(10) Patent No.: US 6,562,523 B1
(45) Date of Patent: May 13, 2003

(54) DIRECT WRITE ALL-GLASS PHOTOMASK BLANKS

(75) Inventors: Che-Kuang Wu, San Diego, CA (US); Laurie Ann Wu, San Diego, CA (US)

(73) Assignee: Canyon Materials, Inc., San Diego, CA (US)

( * ) Notice: Subject to any disclaimer, the term of this patent is extended or adjusted under 35 U.S.C. 154(b) by 0 days.

(21) Appl. No.: 09/507,039

(22) Filed: Feb. 18, 2000

Related U.S. Application Data

(63) Continuation-in-part of application No. 08/961,459, filed on Oct. 30, 1997, now abandoned
(60) Provisional application No. 60/030,258, filed on Oct. 31, 1996.

(51) Int. Cl.$^7$ .............................. G03P 1/08; G03C 5/00; C03F 1/14
(52) U.S. Cl. ........................... 430/5; 430/346; 430/296; 430/13; 430/325; 430/321; 430/322; 430/323; 501/13; 501/56; 501/65; 501/67; 501/69; 501/72
(58) Field of Search .............................. 501/56, 13, 65, 501/66, 67, 69, 72; 428/428, 410, 913; 385/142, 129; 359/885; 430/5, 616, 617, 608, 13, 19, 346, 296, 325, 321, 322, 323

(56) References Cited

U.S. PATENT DOCUMENTS

| | | |
|---|---|---|
| 1,669,908 A | 5/1928 | Long |
| 2,245,783 A | 6/1941 | Hyde |
| 2,494,259 A | 1/1950 | Nordberg |
| 2,554,952 A | 5/1951 | Mockrin et al. |
| 2,566,134 A | 8/1951 | Mockrin et al. |
| 2,604,410 A | 7/1952 | Bryant |
| 2,683,666 A | 7/1954 | Duncan et al. |
| 2,701,215 A | 2/1955 | Kroeck |
| 2,799,590 A | 7/1957 | Armistead |
| 2,913,345 A | 11/1959 | Duncan |
| 2,920,971 A | 1/1960 | Stookey |
| 2,943,059 A | 6/1960 | Beck et al. |
| 3,001,880 A | 9/1961 | Ruskin |
| 3,007,806 A | 11/1961 | Hartwig |
| 3,022,182 A | 2/1962 | Cleek et al. |
| 3,077,414 A | 2/1963 | Wiker |
| 3,397,076 A | 8/1968 | Little et al. |
| 3,419,370 A | 12/1968 | Cramer et al. |
| 3,504,819 A | 4/1970 | Veres |
| 3,528,847 A | 9/1970 | Grego et al. |
| 3,541,330 A | 11/1970 | Eichelberger et al. |
| 3,558,528 A | 1/1971 | Buck et al. |
| 3,589,918 A | 6/1971 | Jahn |
| 3,656,923 A | 4/1972 | Garfinkel et al. |
| 3,677,960 A | 7/1972 | Ishiyama |
| 3,704,467 A | 11/1972 | Frock |
| 3,713,819 A | 1/1973 | Hagenbach et al. |
| 3,840,379 A | 10/1974 | Wolf |
| 3,861,926 A | 1/1975 | Iriam et al. |
| 3,873,328 A | 3/1975 | Brueggemann et al. |
| 3,873,408 A | 3/1975 | Hensler |
| 3,887,348 A | 6/1975 | Plumat et al. |
| 3,888,648 A | 6/1975 | West et al. |
| 3,904,425 A | 9/1975 | Young et al. |
| 3,938,977 A | 2/1976 | Gliemeroth |
| 3,944,697 A | 3/1976 | Ichimura et al. |
| 4,002,482 A | 1/1977 | Coenen |
| 4,026,715 A | 5/1977 | Erickson et al. |
| 4,036,623 A | 7/1977 | Deeg et al. |
| 4,057,408 A | 11/1977 | Pierson et al. |
| 4,086,073 A | 4/1978 | Loukes |
| 4,102,665 A | 7/1978 | Plumat et al. |
| 4,106,946 A | 8/1978 | Ritze |
| 4,118,214 A | 10/1978 | Wedding |
| 4,125,404 A | 11/1978 | Araujo |
| 4,160,654 A | 7/1979 | Bartholomew et al. |
| 4,179,300 A | 12/1979 | Sagara |

(List continued on next page.)

FOREIGN PATENT DOCUMENTS

| | | |
|---|---|---|
| BE | 760371 | 6/1971 |
| FR | 2323648 | 9/1975 |
| GB | 778355 | 7/1957 |
| GB | 804106 | 11/1958 |
| GB | 1290528 | 9/1972 |
| JP | 51-109918 | 3/1975 |
| SU | 579244 | 6/1976 |

OTHER PUBLICATIONS

Daschner et al., *One–step lithography for mass production of multilevel diffractive optical elements using High Energy Beam Sensitive (HEBS) gray level mask*, SPIE Proceedings, Feb. 1–2 1996, vol. 2689, pp 153–155.

(List continued on next page.)

Primary Examiner—Michael Marcheschi
(74) Attorney, Agent, or Firm—Fish & Richardson P.C.

(57) ABSTRACT

A narrowly defined range of zinc silicate glass compositions is found to produce High Energy Beam Sensitive-glass (HEBS-glass) that possesses the essential properties of a true gray level mask which is necessary for the fabrication of general three dimensional microstructures with one optical exposure in a conventional photolithographic process. The essential properties are (1) A mask pattern or image is grainiless even when observed under optical microscope at 1000× or at higher magnifications. (2) The HEBS-glass is insensitive and/or inert to photons in the spectral ranges employed in photolithographic processes, and is also insensitive and/or inert to visible spectral range of light so that a HEBS-glass mask blank and a HEBS-glass mask are permanently stable under room lighting conditions. (3) The HEBS-glass is sufficiently sensitive to electron beam exposure, so that the cost of making a mask using an e-beam writer is affordable for many applications. (4) the e-beam induced optical density is a unique function of, and is a very reproducible function of electron dosages for one or more combinations of the parameters of an e-beam writer. The parameters of e-beam writers include beam accelerations voltage, beam current, beam spot size and addressing grid size.

32 Claims, 24 Drawing Sheets

U.S. PATENT DOCUMENTS

| | | | |
|---|---|---|---|
| 4,191,547 | A | 3/1980 | Wu |
| 4,192,689 | A | 3/1980 | Rinehart |
| 4,287,018 | A | 9/1981 | Gulati et al. |
| 4,290,794 | A | 9/1981 | Wedding |
| 4,311,504 | A | 1/1982 | Nigrin |
| 4,405,672 | A | 9/1983 | Araujo et al. |
| 4,478,677 | A | 10/1984 | Chen et al. |
| 4,530,736 | A | 7/1985 | Mutter |
| 4,567,104 | A | 1/1986 | Wu |
| 4,670,366 | A | 6/1987 | Wu |
| 4,756,733 | A | 7/1988 | Houde-Walter et al. |
| 4,894,303 | A | 1/1990 | Wu |
| 5,078,771 | A | 1/1992 | Wu |
| 5,114,813 | A | 5/1992 | Smoot et al. |
| 5,145,757 | A | 9/1992 | Smoot et al. |
| 5,285,517 | A | 2/1994 | Wu |
| 5,468,595 | A * | 11/1995 | Livesay .................. 430/296 |
| 5,480,764 | A | 1/1996 | Gal et al. |
| 6,107,000 | A * | 8/2000 | Lee et al. ............... 430/296 |

OTHER PUBLICATIONS

Daschner et al., *One–step lithography for mass production of multilevel diffractive optical elements using High Energy Beam Sensitive (HEBS) gray level mask*, OSA Topical Metting 1996 Technical Digest Series, Apr. 29–May 2, 1996, vol. 5, pp 322–324.

Stemmer et al., *High efficiency diffractive coupling lenses by three–dimensional profiling with electron–beam lithography and reactive ion etching*, J. Vac. Sci. Technol. B 12(6), Nov./Dec. 1994, pp 3635–3638.

Stauffer et al., *Electron beam writing of continuous resist profiles for optical applications*, J. Vac. Sci. Technol. B 10(6), Nov./Dec. 1992, pp. 2526–2529.

Andersson et al., *Single photomask, multilevel kinoforms in quartz and photoresist: manufacture and evaluation*, Applied Optics, vol. 29 No. 28, Oct. 1, 1990, pp 4259–4267.

Suleski et al., *Gray scale mask for diffractive–optics fabrication: commercial slide imagers*, Applied Optics, vol 34, No. 32, Nov. 10, 1995, pp 7507–7517.

O'Shea et al., *Gray scale mask for diffractive optics fabricaion: spatially filtered halftone screens*, Applied Optics, vol. 34, No. 32, Nov. 10, 1995, pp 7518–7526.

Oppliger et al., *One–step 3D shaping using a gray tone mask for optical and microelectronic applications*, Microelectronic Engineering 23 (1994), pp 449–454 (no month).

Daschner et al., *Fabrication of diffractive optical elements using a single optical exposure with a gray level mask*, J. Vac. Sci. Technol. B 13(6), Nov./Dec. 1995, pp. 2729–2731.

Korolkov et al., *Fabrication of gray scale masks and diffractive optical elements with LDW–glass*, Proceedings of SPIE vol. 4440, Jul. 2001.

Wu, Che–Kuang, *Journal of Non–Crystalline Solids*, "Stable Silicate Glasses Containing up to 10 Weight Percent of Water", vol. 41, No. 3, Dec. 1980, pp 381–398.

Wu, Che–Kuang, *Journal of The American Ceramic Society*, "Nature of Incorporated Water in Hydrated Silicate Glasses", vol. 63, No. 7–8, Jul.–Aug. 1980, pp. 453–457.

Daschner et al., *General aspheric refractive micro–optics fabricated by optical lithography using a high energy beam sensitive glass gray–level mask*, J.Vac.Sci. Technol. B 14(6) Nov./Dec. 1996; pp 3730–3733.

Daschner et al.; *Cost–effective mass fabrication of multilevel diffractive optical elements by use of a single optical exposure with a gray–scale mask on high–energy beam–sensitive glass*; Applied Optics, Jul. 10 1997, vol. 36, No. 20, pp 4675–4680.

Wang et al., *Laser direct–write gray–level mask and one–step etching for diffractive microlens fabrication*; Applied Optics, Nov. 10 1998, vol. 37, No. 32, pp 7568–7576.

Huang et al., *Characterization of erasable inorganic photochromic media for optical disk data storage*; Journal of Applied Physics, vol. 83, No. 7, Apr. 1 1998, pp 3795–3799.

Wang et al., *Multilevel diffractive microlens fabrication by one–step laser–assisted chemical etching upon high–energy–beam sensitive glass*; Optics Letters / vol. 23, No. 11, Jun. 1, 1998, pp 876–878.

Huang et al., *High–efficiency flat–top beam shaper fabricated by a nonlithographic technique*; Optical Engineering, vol. 38, No. 2, Feb. 1999, pp 208–213.

Korolkov et al.; *Application for gray–scale LDW–glass masks for fabrication of high–efficiency DOEs*; Diffractive/holographic technologies, systems and spatial light modulators; Proceedings of SPIE, vol. 3633, 27–29, Jan. 1999.

Kley et al.; *Adapting existing e–beam writers to write HEBS–glass gray scale masks*; Diffractive/Holographic Technologies, Systems for spatial light modulators VI; Proceedings of SPIE, vol. 36–33, 27–29, Jan. 1999.

Lee et al.; *Method for Providing Micro–Optics Using Gray Level Masks*; International Application No. PCT/US97/23701; Publication No. WO 98/27459; Jun. 25 1998.

* cited by examiner a.) HEBS-Glass mask material exposed in e-beam writer b.) Gray-Level mask generated in HEBS-Glass c.) Photoresist exposure in optical lithography tool d.) Resist surface profile after development e.) Surface profile in substrate material after CAIBE transfer step

DIRECT WRITE ALL-GLASS PHOTOMASK BLANKS

CROSS REFERENCE TO RELATED APPLICATIONS

This application is a continuation-in-part of pending U.S. patent application Ser. No. 08/961,459, filed Oct. 30, 1997, now abandoned which is a continuation in part of U.S. Provisional Patent Application No. 60/030,258, filed Oct. 31, 1996.

BACKGROUND OF THE INVENTION

U.S. Pat. Nos. 4,567,104; 4,670,366; 4,894,303; and 5,078,771 and 5,285,517, all of inventions of Che-kuang Wu, described High Energy Beam Sensitive glass (HEBS-glass) articles exhibiting insensitivity and/or inertness to actinic radiation, the HEBS-glass articles which are darkened and/or colored within a thin surface layer of about 0.1–3 $\mu$m upon exposure to a high energy beam, electron beam, and ion beams in particular, without a subsequent development step, and which need no fixing to stabilize the colored image, since both the recorded image and the glass article are insensitive to radiation in the spectral range of uv and longer wavelengths. These patents are concerned with Ag+ ion-exchanged glass articles having base glass within alkali metal silicate composition fields containing at least one of the oxides of transition metals which have one to four d-electrons in an atomic state. The base glass composition can be varied widely, spontaneous reduction as well as photo-reduction of Ag+ ions are inhibited and/or eliminated due to the presence of said transition metal oxides in the glass article. The HEBS-glass is suitable for use as recording and archival storage medium and as phototools. The recorded images and/or masking patterns are up-datable, can be any single color seen in the visible spectrum, and is erasable by heat at temperatures above about 200° C. Heat erasure mode of recording in the high energy beam darkened glass article using a high intensity light beam, focused laser beam in particular, was also described.

Diffractive optics technology is maturing see for example, the publication by C. W. Chen and J. S. Anderson, "Imaging by diffraction: grating design and hardware results," in Diffractive and Miniaturized Optics, S. H. Lee, ed., Vol. CR49 of SPIE Critical Reviews Series (Society of Photo-Optical Instrumentation Engineers,. Bellingham, Wash., 1993) pp. 77–97. Diffractive Optical Elements (DOE's) of various designs have been found useful for improving the design and performance of optical systems. Instead of using the binary method, such as described in "Binary Optics Technology: The Theory and Design of Multi-level Phase Diffractive Optical Elements" by G. J. Swanson of MIT, documented in MIT Tech. Rep. 854. (MIT, Cambridge, Mass., 1989), a cost-effective way of fabricating large numbers of DOE's in the shortest possible turnaround time has become increasingly important. Gray scale mask fabrication methods offer these features by drastically reducing the amount of processing steps involved to generate a multilevel and monolithic DOE. Currently multiplexing schemes exist to fabricate a quasi-gray-scale mask by changing the number of area of openings in a binary mask (similar to the halftone method) or by photographic emulsions. These approaches were described by Y. Opplinger etal in Microelcetron Eng. 23, 449–454 (1994) and by H. Anderson etal in Appl. Opt. 29, 4259–4267 (1990). Other methods of fabrication of gray-scale masks involve the cumberstone task of multiple binary exposures and following evaporation steps such as described by W. Daschner, etal in J. Vac. Sci. Technol. B 13, 2729–2731 (1995). The High Energy Beam Sensitive (HEBS) glass of the present invention offers the advantage of a one-step fabrication of a true gray-scale masks.

SUMMARY OF THE INVENTION

Since there is no graininess, HEBS-glass is capable of resolution to molecular dimensions. HEBS-glass turns dark instantaneously upon exposure to an electron beam, the more electron dosage the more it darkens. Therefore, HEBS-glass is ideally suited for making gray level masks. HEBS-glass gray level masks can be written with an e-beam writer using a 0.1 $\mu$m addressing grid size. Every 0.1 $\mu$m spot in the 5"×5" HEBS-glass plate acquires a predetermined transmittance value ranging from 100 percent down to less than 0.1 percent upon e-beam patterning with a predetermined dosage for each address. A gray level mask made of HEBS-glass do not rely on a half tone method. Therefore, it is a true gray level mask.

It is the objective of the present invention to design HEBS-glass compositions so that the HEBS-glass gray level mask of the present invention facilitates new designs and low cost manufacturing processes for high-performance diffractive optics; asymmetric, irregularly shaped microlens arrays; and general three dimensional surfaces.

Application of the HEBS-glass of the present invention include micro-optical devices, microelectrical devices, micro-opto-electromechanical devices, integrated optical devices, two-dimensional fanout gratings, optical interconnects, fiber pigtailing, diffractive optical elements, refractive microlens arrays, microprism arrays, micromirror arrays and Bragg grating.

The essential properties of a HEBS-glass gray level mask which is necessary for the fabrication of general three dimensional microstructures are;

1. A mask pattern or image is grainless even when observed under optical microscope at 1000× or at higher magnifications.
2. The HEBS-glass is insensitive and/or inert to photons in the spectral ranges employed in photolithographic processes, and is also insensitive and/or inert to visible spectral range of light so that a HEBS-glass mask blank and a HEBS-glass mask are permanently stable under room lighting conditions.
3. The HEBS-glass is sufficiently sensitive to electron beam exposures, so that the cost of making a mask using an e-beam writer is affordable for many applications.
4. The e-beam induced optical density is a unique function of, and is a very reproducible function of electron dosages for one or more combinations of the parameters of an e-beam writer. The parameters of e-beam writers include beam acceleration voltage, beam current, beam spot size and addressing grid size.

The essential properties No. 1 and No. 2 are properties of HEBS-glasses described in the US patents listed above. However, HEBS-glass compositions having a better e-beam sensitivity is in general more sensitive to photon energy as well.

It is the objective of the present invention to optimize HEBS-glass composition so that the HEBS-glass of the present invention is sufficiently sensitive to electron beam and that the cost of writing a gray level mask is affordable for many applications, and yet HEBS-glass of the present invention is totally inert to actinic radiation of 436 nm and longer wavelengths and has no sensitivity to actinic radiation at 365 nm for practical purposes eg. no significant darkening for 1,000,000 exposures in I-line steppers.

It has been determined that with a given value of e-beam exposure dosage the e-beam induced optical density in HEBS-glass is a function of beam acceleration voltage, of beam spot size, of beam current and of addressing grid size. Therefore, it is another objective of the present invention to design e-beam write schemes such that the essential properties No. 3 and No. 4 of a HEBS-glass gray level mask are both fulfilled.

The present invention is directed to a gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

In one embodiment, at least one gray scale zone has a continuous gray scale comprising a plurality of grade scale levels.

The present invention is also directed to a method of making a gray scale mask comprising writing on a plurality of areas on at least a portion of a High Energy Beam Sensitive-glass (HEBS-glass) with an electron beam having an acceleration voltage of 20 to 30 kilovolts, a beam current of 25 to 175 nanoamps, and addressing a grid size of 0.1 to 0.4 micron; the writing carried out at an electron dosage that falls on the net optical density vs. electron dosage sensitivity curve of the High Energy Beam Sensitive-glass, the initial slope of the sensitivity curve being from 2.454 to 12.507 per electron dosage unit of milli-coulombs/cm$^2$; the exposure duration of the writing on each area are different than the exposure duration of the immediate adjacent areas; the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

The present invention is also directed to a method of making a three dimensional microstructure with three dimensional surfaces in a photoresist comprising exposing a photoresist to a gray scale pattern in a gray scale mask using an optical lithography tool and developing the exposed photoresist to form three dimensional microstructures in the photoresist;

the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

The present invention is also directed to an analog photoresist with a three dimensional microstructure produced by exposing a photoresist to a gray scale pattern in a gray scale mask using an optical lithography tool and developing the exposed photoresist to form the three dimensional microstructure in the photoresist; the gray scale mask comprising:

A gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being TiO$_2$ 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

The present invention is also directed to a method of producing three dimensional microstructures in substrate material comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is directed to a component having a three dimensional microstructure selected from the group consisting of tapered structures for microelectronics, micro-optical devices, integrated optical components, micro-electro-mechanical devices, micro-opto-electro-mechanical devices, microelectrical devices, diffractive optical elements (DOE), refractive microlens arrays, micromirror arrays, and diffractive microlens arrays; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a component having a three dimensional microstructure selected from the group consisting of electrical connections between two metallic layers separated by tapered structures of thick polyimide, bifocal intraocular lenses, widely asymmetric DOE, random phase plate DOEs, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separation, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro- mechanical sensors and actuators, micro valves, inertial micro sensors, micro machined RF switches, GPS component miniaturization devices, laser scanners, optical shutters, dynamic micro mirrors, optical choppers and optical switches; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is directed to a method of producing a component having a three dimensional microstructure selected from the group consisting of tapered structures for microelectronics, micro optical devices, integrated optical components, micro-electro-mechanical devices, micro-opto-electro-mechanical devices, diffractive optical elements, refractive microlens arrays, diffractive microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/$cm^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a method of producing a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separations, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical shoppers and optical switches; the microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask using an optical lithography tool and developing the exposed photoresist to from three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/$cm^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a Laser Direct Write-glass (LDW-glass) which is a High Energy Beam Sensitive-glass (HEBS-glass) having at least a portion uniformly darkened to a uniform optical density, said LDW-glass prior to being darkened with an electron beam is a transparent HEBS-glass which in bodies 0.090 inch cross section will exhibit the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/$cm^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a gray scale mask on a Laser Direct Write glass (LDW-glass) produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

In an alternative embodiment of the gray scale mark, the gray scale zone has a continuous gray scale comprising a plurality of grade scale levels.

The present invention is also directed to a method of making a gray scale mask comprising darkening at least a portion of a High Energy Beam Sensitive-glass (HEBS-glass) with an electron beam to form a Laser Direct Write-glass having uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

In one embodiment of the method, the focused laser beam exposure write time for each area exposed is different. In another embodiment of the method, the focused laser beam intensity for each area exposed is different. In still another embodiment of the method, the number of retraces of the focused laser beam writing for each area exposed is different.

The present invention is also directed to a method of making a three dimensional microstructure with three dimensional surfaces in a photoresist comprising exposing a photoresist to a gray scale pattern in a gray scale mask on a Laser Direct Write-glass ((LDW-glass) using an optical lithography tool and developing the exposed photoresist to form three dimensional microstructures in the photoresist; A gray scale mask on a Laser Direct Write glass (LDW-glass) produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is also directed to an analog photoresist with a three dimensional microstructure produced by exposing a photoresist to a gray scale pattern in a gray scale mask on a Laser Direct Write-glass (LDW-glass) using an optical lithography tool and developing the exposed photoresist to form the three dimensional microstructure in the photoresist; the gray scale mask comprising: A gray scale mask on a Laser Direct Write glass (LDW-glass) produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a method of producing three dimensional microstructures in substrate material comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a LDW-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and
(b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a component having a three dimensional microstructure selected from the group consisting of tapered structures for microelectronics, micro-optical devices, integrated optical components, micro-electro-mechanical devices, micro-opto-electro-mechanical devices, microelectrical devices, diffractive optical elements (DOE), refractive microlens arrays, micromirror arrays, and diffractive microlens arrays; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a LDW-glass having at least one gray scale zone with a plurality of gray scale levels, each gray scale level having, a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and
(b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separation, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical choppers and optical switches; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a transparent High Energy Beam Sensitive-glass having at least one gray scale zone with a plurality of gray scale levels, each gray scale level having a different optical density, the gray scale produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a method of producing a component having a three dimensional microstructure selected from the group consisting of tapered structures for microelectronics, micro optical devices, integrated optical components, micro-electro-mechanical devices, micro-opto-electro-mechanical devices, diffractive optical elements, refractive microlens arrays, diffractive microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a transparent High Energy Beam Sensitive-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is also directed to a method of producing a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separations, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical shoppers and optical switches; the microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask on a Laser Direct Write-glass (LDW-glass) using an optical lithography tool and developing the exposed photoresist to from three dimensional microstructures in the photoresist; the gray scale mask comprising a transparent High Energy Beam Sensitive-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section will exhibit the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

DESCRIPTION OF THE INVENTION

Figure 1:
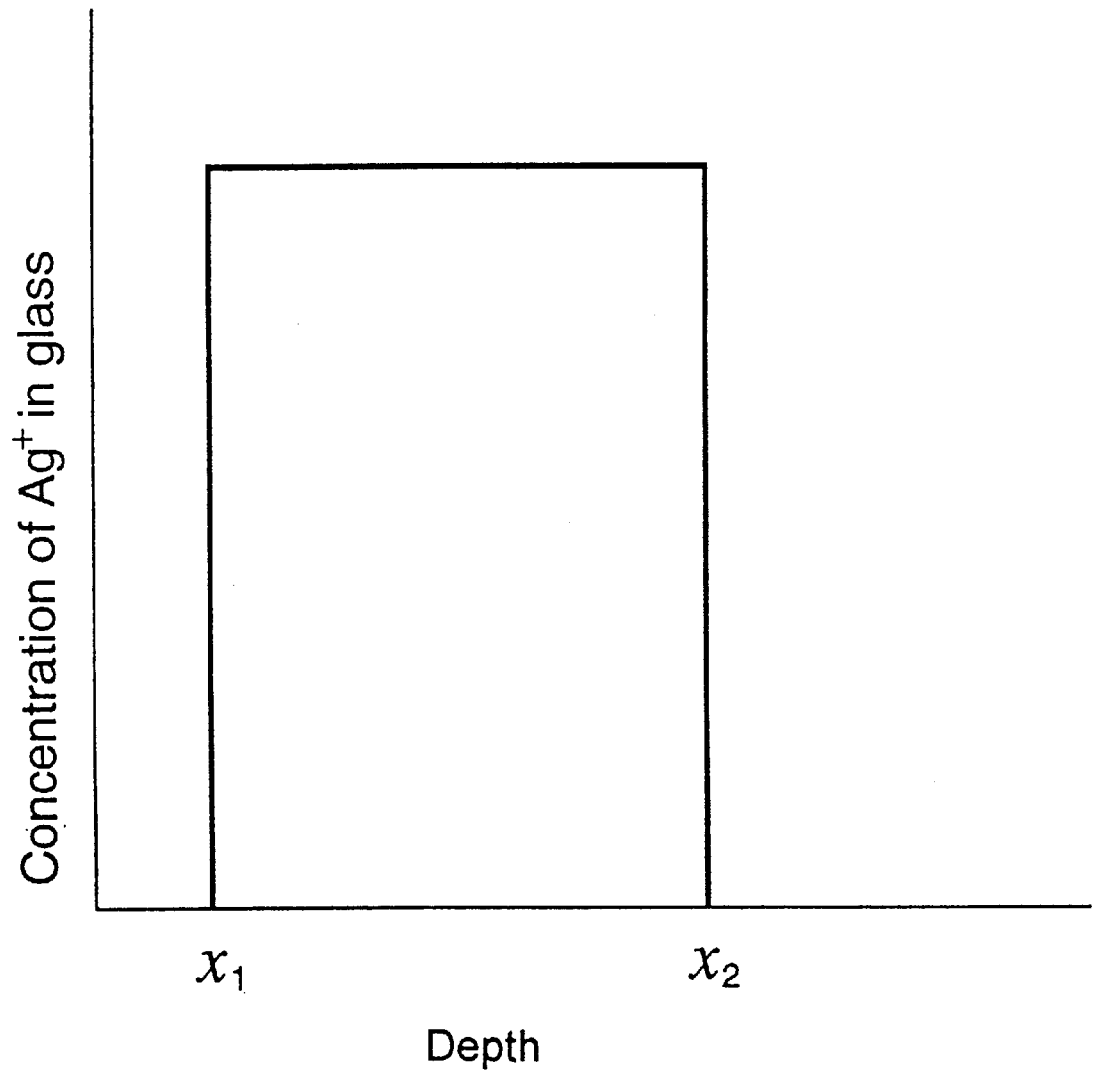
FIG. 1 illustrates a qualitative representation of the silver concentration profile in HEBS-glass.
Figure 2:
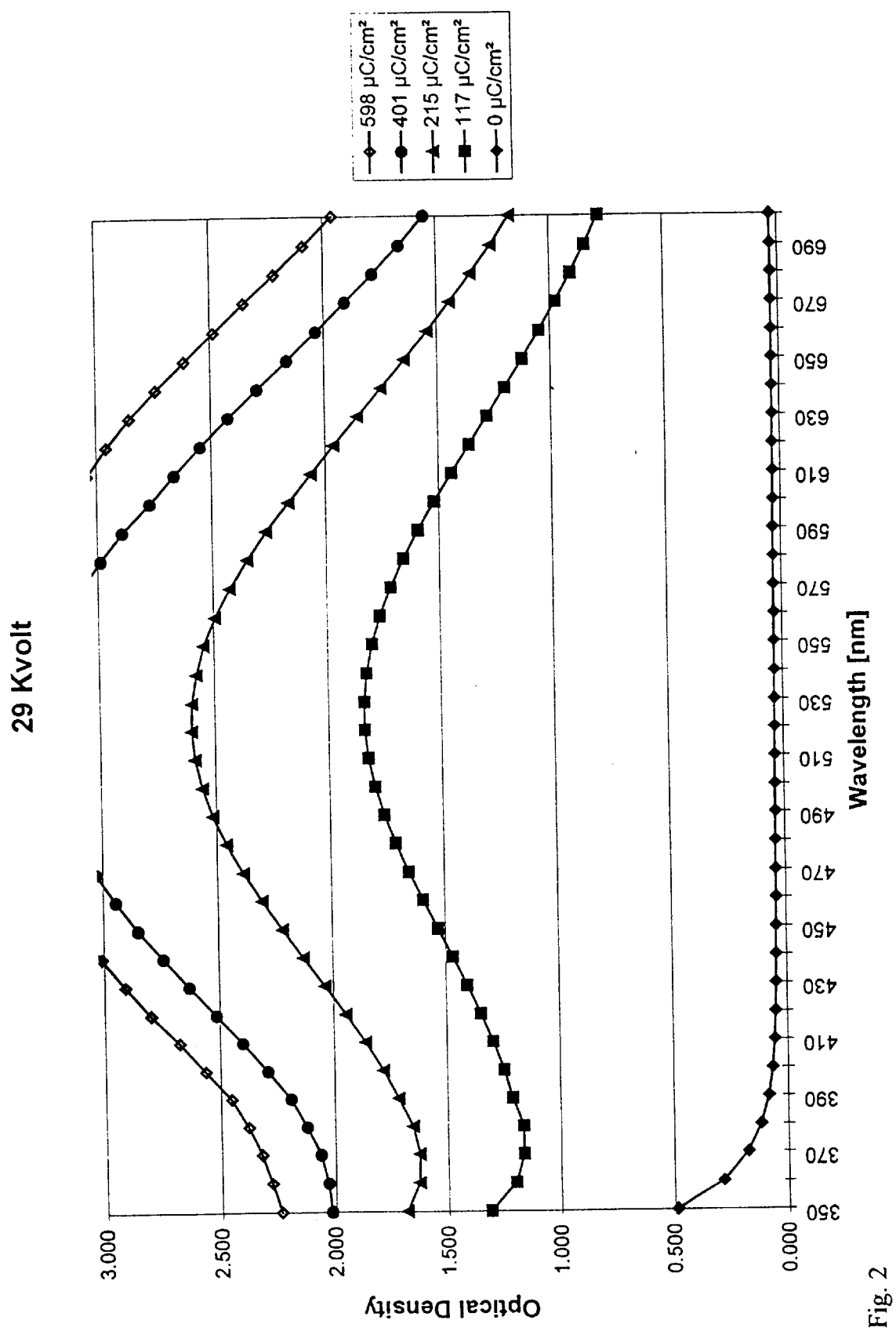
FIG. 2 records absorbence spectra of HEBS-glass No. 3 after flood exposure with e-beam at 29 kV acceleration voltage.
Figure 3:
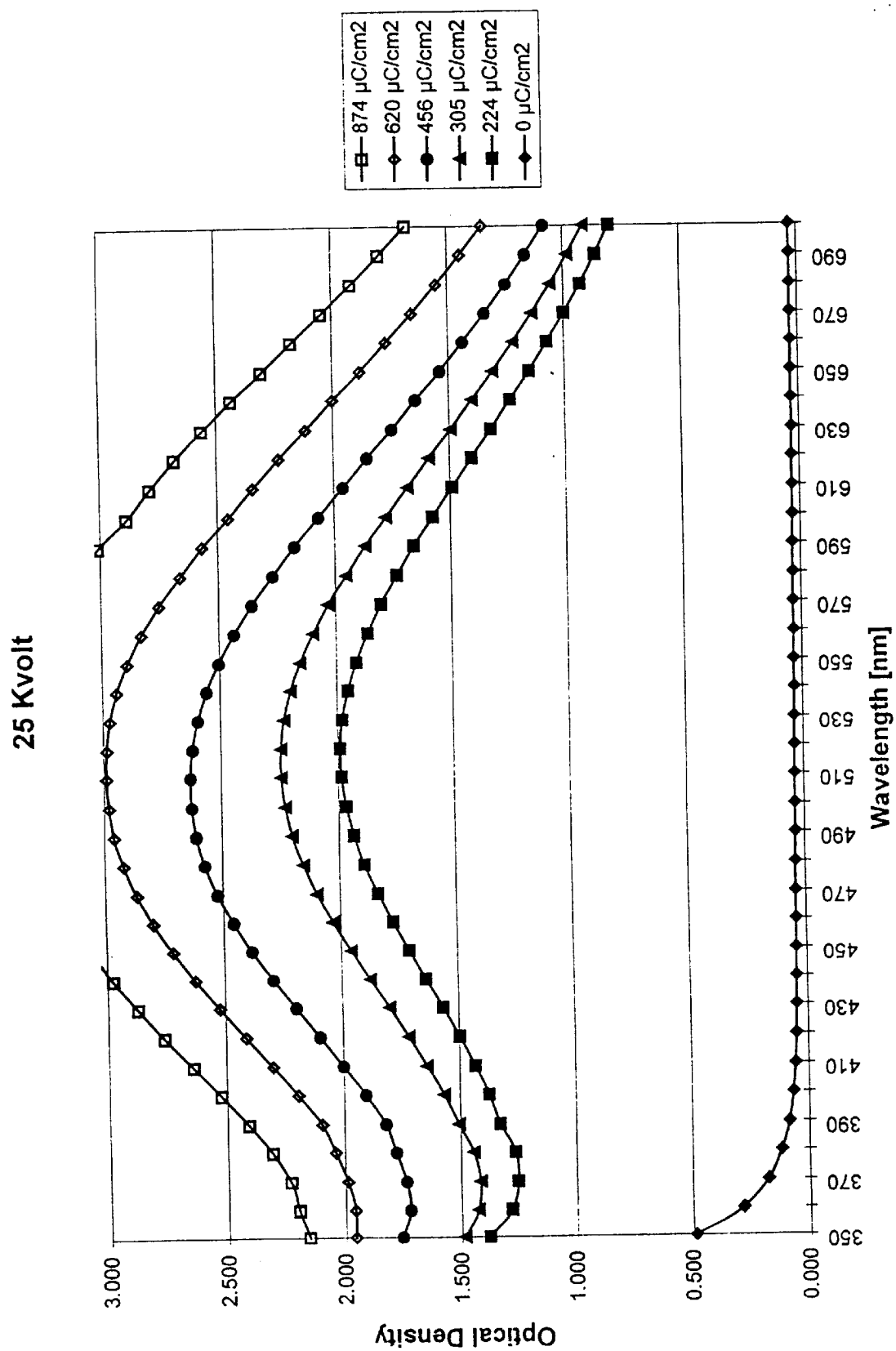
FIG. 3 records absorbence spectra of HEBS-glass No. 3 after flood exposure with e-beam at 25 kV acceleration voltage.
Figure 4:
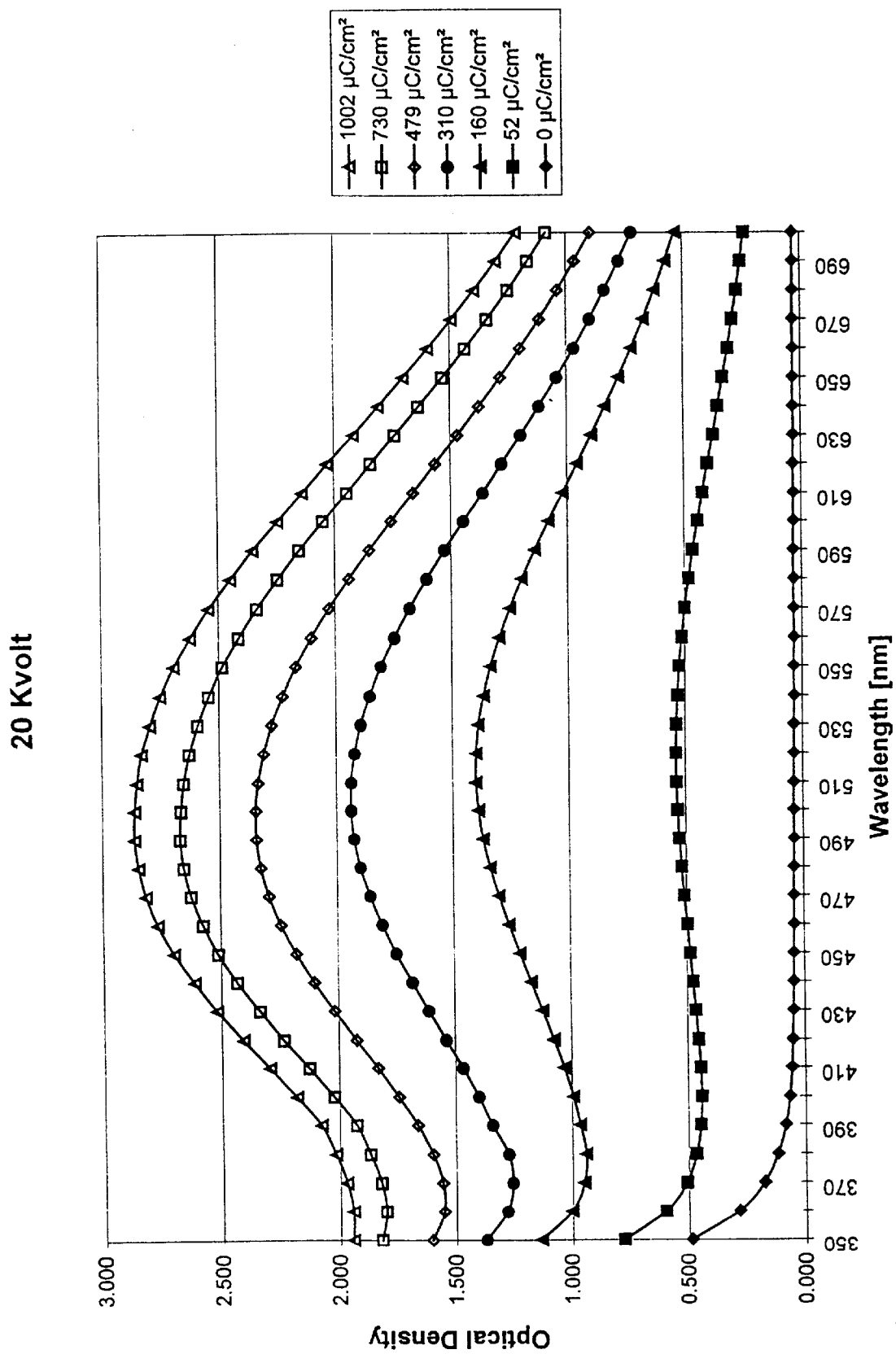
FIG. 4 records absorbence spectra of HEBS-glass No. 3 after flood exposure with e-beam at 20 kV acceleration voltage.
Figure 5:
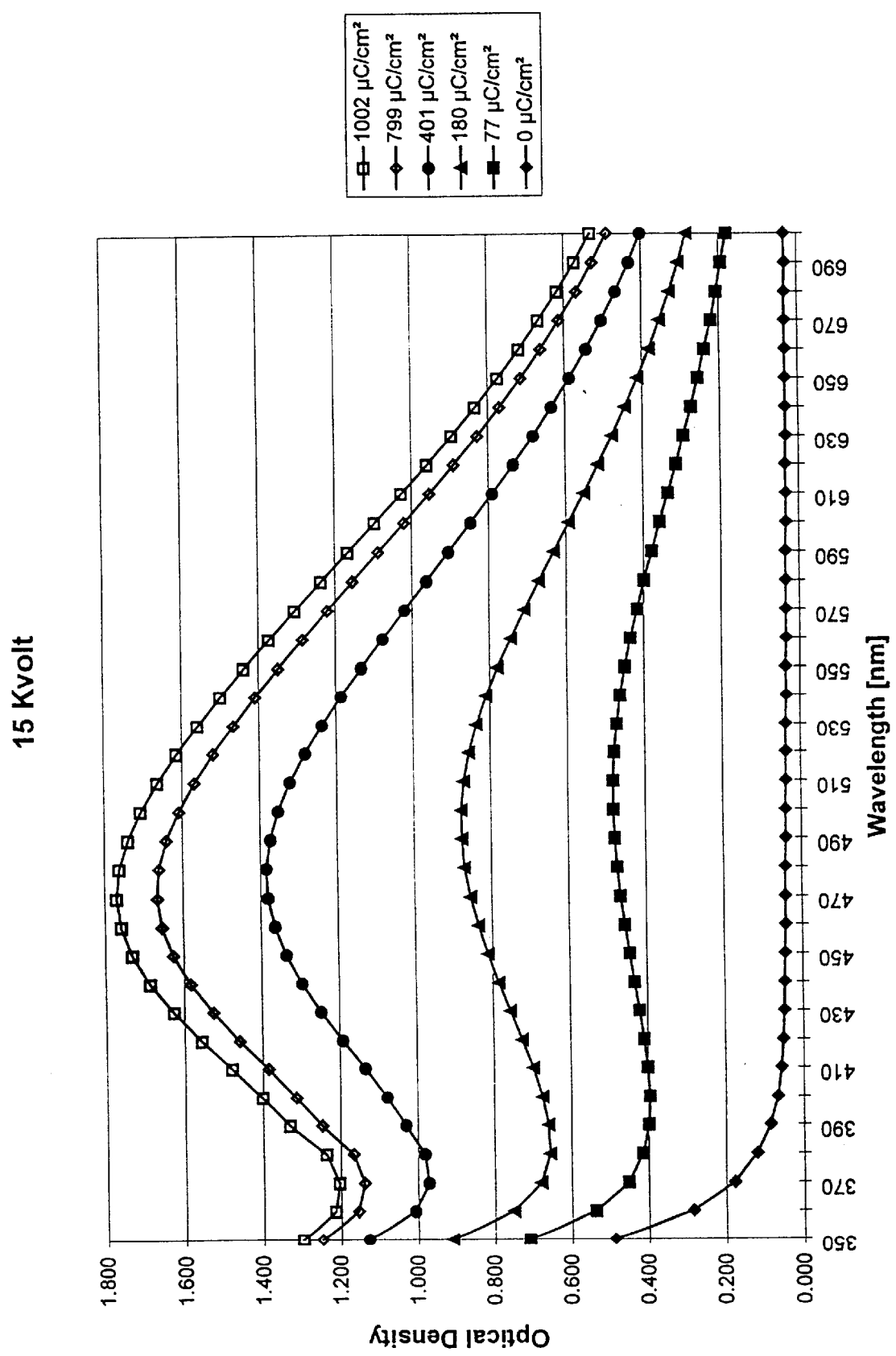
FIG. 5 records absorbence spectra of HEBS-glass No. 3 after flood exposure with e-beam at 15 kV acceleration voltage.

High energy beam sensitive glasses used to generate the gray level mask, consist of a low expansion zinc-silicate glass, a white crown glass. The base glass can be produced from glass melting just like the conventional white crown optical glasses. The base glass contains alkali to facilitate the following ion-exchange reactions which achieve the sensitivity of the HEBS-glass towards high energy beams, e-beam in particular. After ion-exchange HEBS-glass is essentially alkali free as a result of the ion-exchange process and the concurrent leaching process carried out in an acidic aqueous solution at temperatures above 320° C. The base glass composition consists of silica, metal oxides, halides and photo inhibitors. Typically $TiO_2$, $Nb_2O_5$ or $Y_2O_3$ are used as photo inhibitors. The photo inhibitors are used to dope the silver ion containing complex crystals, silver-alkali-halide. These $(AgX)_m(MX)_n$ complex crystals are the beam sensitive material and the doping of the photo inhibitors increases the energy band gap of the otherwise photo-sensitive glass.

The exemplary glass compositions that are optimized for making HEBS-glass gray level masks are listed in Exhibit A. Photosensitivity inhibitors and RS-suppression agents other than $TiO_2$, selected from the group consisting of $Ta_2O_5$, $ZrO_2$, $Nb_2O_5$, $La_2O_3$, $Y_2O_3$ and $WO_3$ may optionally be added to the glass batch or replaces portions of $TiO_2$ in the base glass compositions of Exhibit A. More than about 1% of Cl is added in the forms of Alkali Chloride to the glass batch to ensure that the glass melt is saturated with chlorides. The Chlorides also function as a fining agent for the glass melt.

The base glass compositions of the present invention consist in the glass batch essentially of, in mole percent on the oxide basis, 11.4 to 17.5% of one or more alkali metal oxides, 2.4 to 10.2% total of photo sensitivity inhibitors and RS suppression agents including 2.4 to 10.2% $TiO_2$, 1.1 to 2.4% $Al_2O_3$, 0 to 4.6% $B_2O_3$, 3.7 to 13.2% ZnO, 0.5 to 6% Cl, and 58.2 to 78.8% $SiO_2$.

After the glass is melted, drawn, ground and polished the base glass plates are ion-exchanged in an acidic aqueous solution containing soluble ionic silver. The ion exchange process is carried out at temperatures in excess of 320° C. for a duration sufficient to cause silver ions to diffuse into the glass plates 3 μm, i.e., $(x_2-x_1)$ in the thickness dimension of FIG. 1. As a result silver ions are present in the form of silver-alkali-halide $(AgX)_m(MX)_n$ complex crystals that are about 10 nm in each dimension within the cavity of the $SiO_4$ tetrahedron network.

Ground and polished glass plates of the exemplary glass compositions of Exhibit A were ion exchanged in aqueous solution containing ionic silver. The aqueous ion exchange solution consists, on the weight percent basis, 7.5% or more of $AgNO_3$ and 0.5% or more of $HNO_3$. HEBS-glass No. 1 to No. 20 are the glass plates of the exemplary base glass compositions No. 1 to No.20 respectively having been ion exchanged in the aqueous ion exchange solution.

Doping of the base glass with the photo inhibitors causes an increased energy band gap, making the ion exchanged glasses inert to UV and actinic radiation of shorter wavelengths as the concentration of the doping with photo inhibitors increases. Nevertheless the chemical reduction of silver ions in the silver-alkali-halide containing complex crystals to produce coloring specks of silver atoms can be accomplished by exposing the HEBS-glass to high energy beams, eg., $\geq 10$ kV electron beams. This property of the material can be utilized to generate the necessary change in transmission for a gray level mask.

FIGS. 2 to 5 exhibit the resulting optical density of the HEBS-glass No. 3 of the exemplary base glass composition No. 3 after exposure with a flood electron beam exposure system using a 29 kV, a 25 kV, a 20 kV and a 15 kV electron beam respectively at a number of dosage levels. The flood e-beam exposure system manufactured and marketed by EVC Corporation, San Diego, Calif., has a beam diameter of 8 inches and was operated at a beam current of 2 milli amp. The absorption data was collected using a Hitachi U2000 spectrophotometer.

Figure 6:
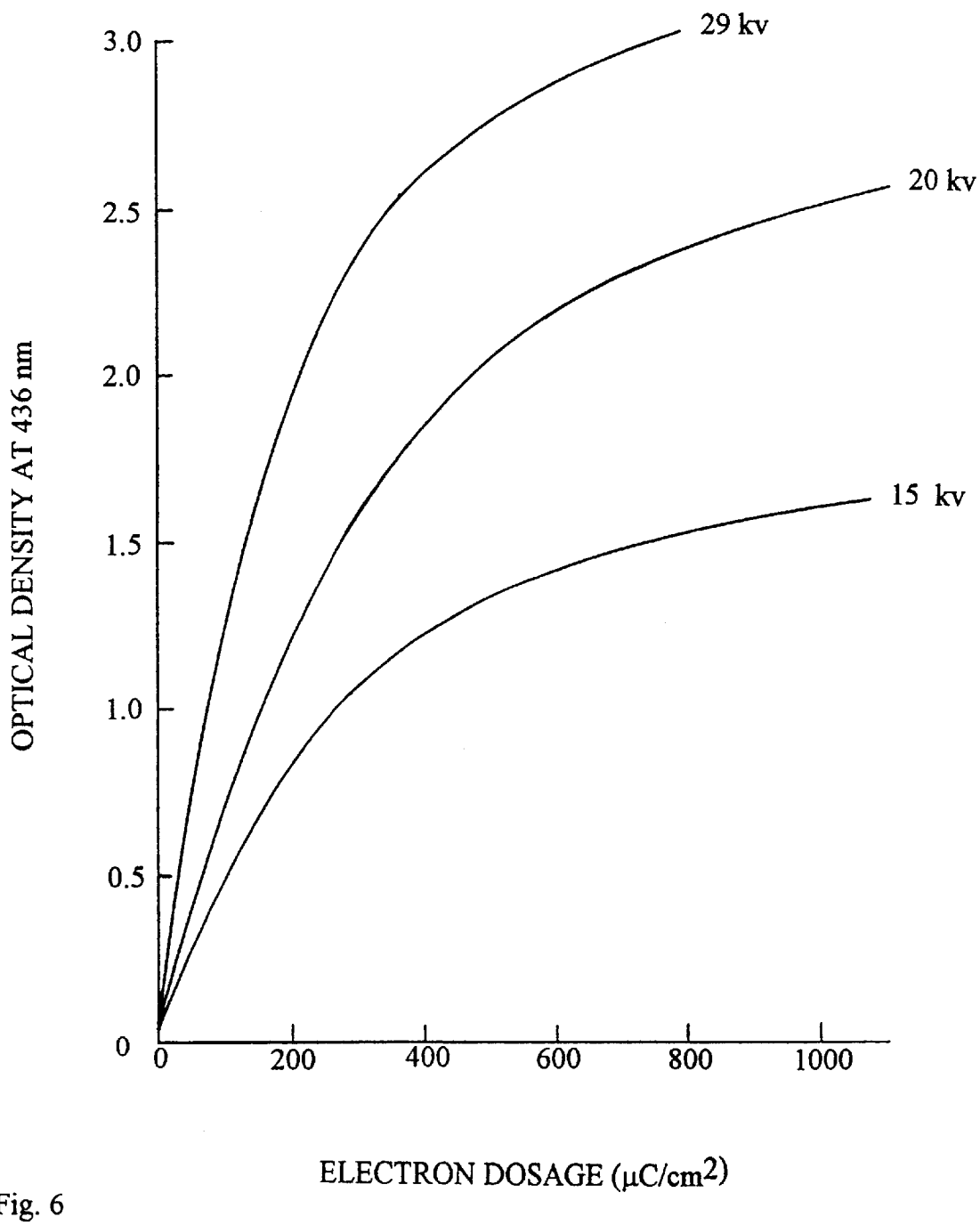
FIG. 6 depicts optical density at 436 nm of HEBS-glass No. 3 versus electron dosage. Electron beam exposure was done with EVC flood exposure system at 29 kV, 20 kV, and 15 kV.

Optical density values of HEBS-glass No. 3 at 436 nm as a function of e-beam dosage is plotted in FIG. 6 for e-beam acceleration voltages of 29 kV, 20 kV and 15 kV. In this plot the finite optical density value at zero electron dosage is due to reflection loss of probing light beam at two surfaces of glass plate samples. To

EXHIBIT A

Exemplary Glass Compositions

| | GLASS NO. | | | | | | | | | |
|---|---|---|---|---|---|---|---|---|---|---|
| | 1 | 2 | 3 | 4 | 5 | 6 | 7 | 8 | 9 | 10 |
| $SiO_2$ | 71.5 | 78.8 | 68.5 | 72.7 | 70.9 | 68.9 | 67.4 | 67.1 | 66.1 | 63.8 |
| $Li_2O$ | 3.3 | 3.4 | 3.8 | 3.6 | 3.7 | 3.9 | 3.9 | 4.2 | 4.2 | 4.5 |
| $Na_2O$ | 5.3 | 5.4 | 6.4 | 5.7 | 5.6 | 6.2 | 6.2 | 6.7 | 6.7 | 7.2 |
| $K_2O$ | 2.8 | 2.7 | 3.2 | 3.1 | 3.1 | 3.3 | 3.3 | 3.5 | 3.5 | 3.8 |
| $TiO_2$ | 2.4 | 4.3 | 4.6 | 3.4 | 4.5 | 5.6 | 4.5 | 5.4 | 5.4 | 6.7 |

EXHIBIT A-continued

Exemplary Glass Compositions

| | | | | | | | | | | |
|---|---|---|---|---|---|---|---|---|---|---|
| $Al_2O_3$ | 1.3 | 1.2 | 1.3 | 1.4 | 1.2 | 1.1 | 1.3 | 1.2 | 1.1 | 1.6 |
| ZnO | 7.2 | 3.7 | 7.4 | 7.1 | 6.0 | 7.0 | 9.0 | 7.1 | 8.2 | 7.6 |
| $Ta_2O_5$ | | | | | | | | | | |
| $Nb_2O_3$ | | | | | | | | | | |
| $ZrO_2$ | | | | | | | | | | |
| $WO_3$ | | | | | | | | | | |
| $B_2O_3$ | 3.2 | | 1.8 | | 2.0 | 1.0 | 1.4 | 1.8 | 0.8 | 1.8 |
| Cl | 3.0 | 0.5 | 3.0 | 3.0 | 3.0 | 3.0 | 3.0 | 3.0 | 3.0 | 3.0 |

GLASS NO.

| | 11 | 12 | 13 | 14 | 15 | 16 | 17 | 18 | 19 | 20 |
|---|---|---|---|---|---|---|---|---|---|---|
| $SiO_2$ | 64.8 | 64.0 | 60.1 | 60.5 | 58.2 | 69.7 | 64.2 | 64.5 | 66.3 | 67.8 |
| $Li_2O$ | 4.5 | 4.7 | 4.3 | 5.1 | 5.1 | 3.9 | 3.8 | 3.8 | 3.8 | 3.8 |
| $Na_2O$ | 7.4 | 7.6 | 7.8 | 8.1 | 8.1 | 6.2 | 6.4 | 6.4 | 6.4 | 6.4 |
| $K_2O$ | 3.6 | 4 | 4.2 | 4.3 | 4.3 | 3.3 | 3.2 | 3.2 | 3.2 | 3.2 |
| $TiO_2$ | 5.4 | 7.4 | 6.1 | 10.2 | 5.7 | 4.4 | 4.6 | 4.6 | 4.6 | 4.6 |
| $Al_2O_3$ | 1.2 | 1.2 | 1.5 | 1.2 | 2.4 | 1.2 | 1.3 | 1.3 | 1.3 | 1.3 |
| ZnO | 10.1 | 8.1 | 11.0 | 7.1 | 13.2 | 7.1 | 7.4 | 7.4 | 7.4 | 7.4 |
| $Ta_2O_5$ | | | | | | | 1.6 | | | |
| $Nb_2O_3$ | | | | | | | | 1.2 | | |
| $ZrO_2$ | | | | | | | | | 2.0 | |
| $WO_3$ | | | | | | | | | | 0.5 |
| $B_2O_3$ | 1.8 | | 2.0 | 0.5 | | 2.0 | | 4.6 | 2.0 | 2.0 |
| Cl | 1.2 | 3.0 | 3.0 | 3.0 | 3.0 | 2.2 | 6.0 | 3.0 | 3.0 | 3.0 | obtain an optical density value of 1.0 at 436 nm in HEBS-glass the required electron dosage is 75 $\mu C/cm^2$, 155 $\mu C/cm^2$ and 270 $\mu C/cm^2$ using EVC e-beam exposure system at 29 kV, 20 kV and 15 kV respectively.

The e-beam exposure-induced optical density i.e. net optical density in HEBS-glass is a function of e-beam exposure scheme and write parameters which include e-beam energy (i.e. e-beam acceleration voltage), beam spot size, beam current and addressing grid. The net optical density is defined herein as the optical density of the e-beam darkened area minus the optical density of the clear (unexposed) area.

The net optical density in the visible spectral range was measured as a function of electron dosage using HEBS-glass No.3 having been exposed in a number of 3 mm×3 mm square areas with the following e-beam pattern generators:

(1) MEBES of ETEC Systems, Inc., (2) Cambridge EBMF 10.5 e-beam writer. Results of exemplary exposure schemes are discussed immediately below.

Figure 7A:
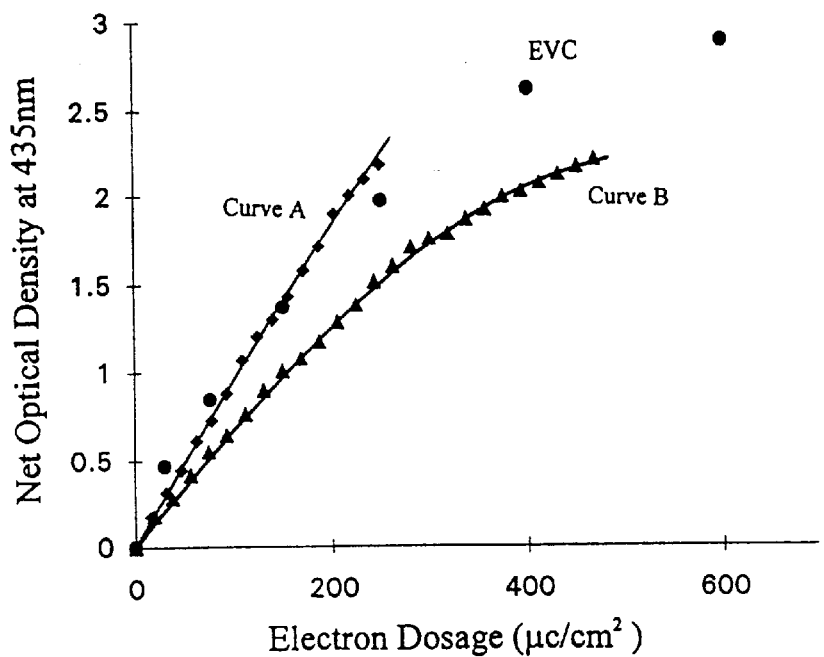
FIG. 7(a) records net optical density at 435 nm versus electron dosage at 30 kV. Curve A—250 na, 0.4 µm address size, Curve B—75 na, 0.2 µm address size, EVC—e-beam flood exposure.

FIG. 7(a) exhibits net optical density values of HEBS-glass No. 3 at 435 nm vs. electron dosage at 30 kv. The e-beam exposure was done using the vector scan e-beam writer, Cambridge EBMF 10.5. The e-beam parameters are as follows:

Curve A—30 kv, 250 na beam current, 0.4 $\mu$m addressing grid spacing.

Curve B—30 kv, 75 na beam current, 0.2 $\mu$m addressing grid spacing.

The data points of the net optical density values at 435 nm resulting from EVC flood gun exposure at 30 kV are shown in the figure for comparison.

Figure 7B:
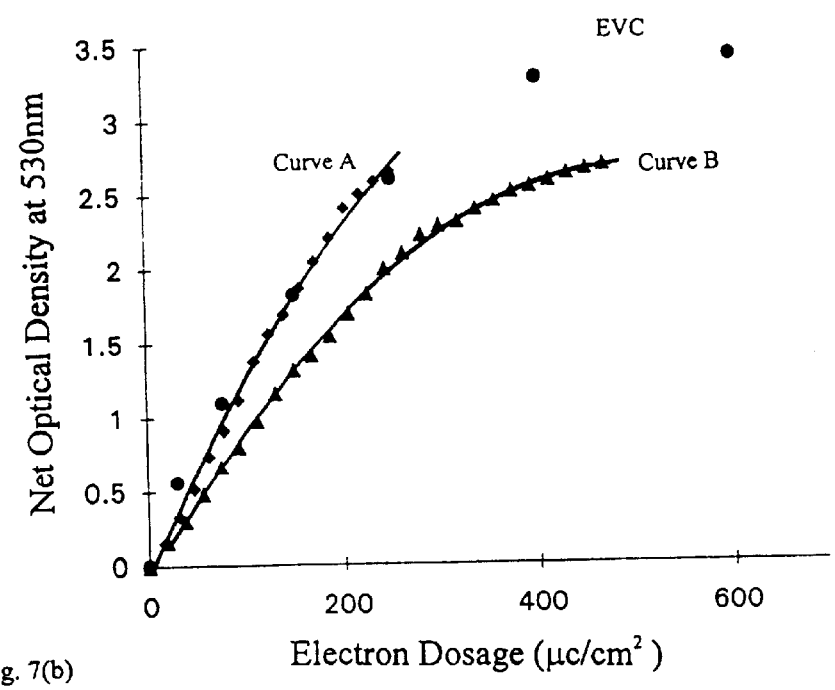
FIG. 7(b) records net optical density at 530 nm versus electron dosage at 30 kV. Curve A—250 na, 0.4 µm address size, Curve B—75 na, 0.2 µm address size, EVC—e-beam flood exposure.

FIG. 7(b) displays the corresponding net optical density values at 530 nm as a function of electron dosage at 30 kv.

Figure 7C:
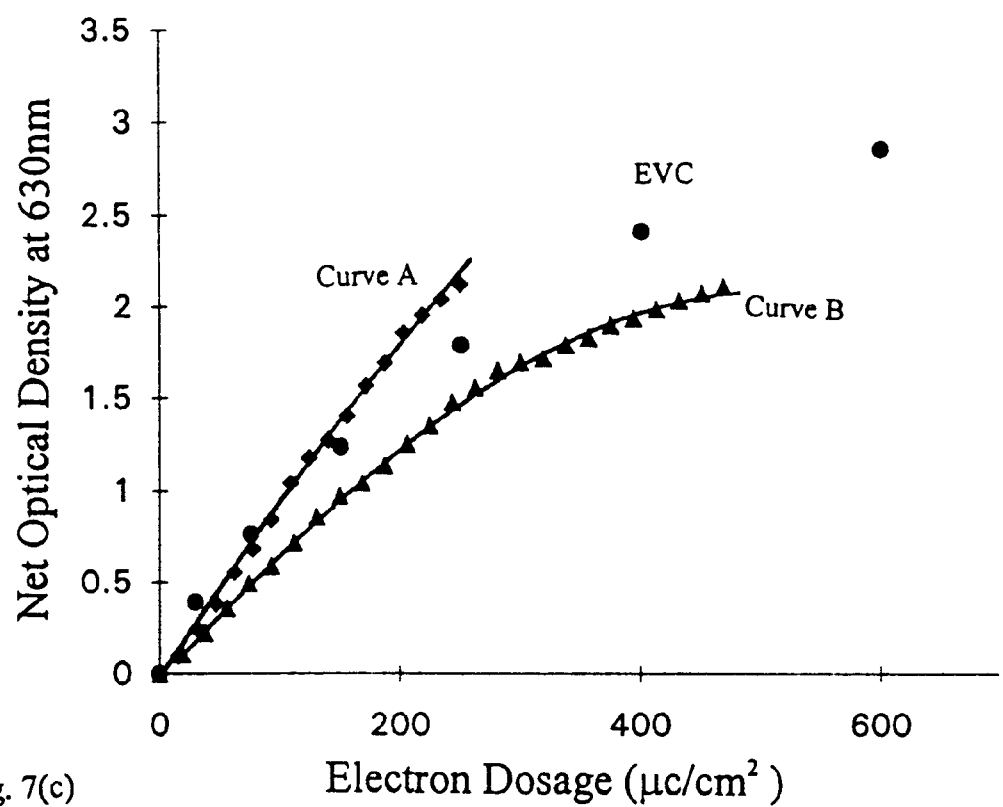
FIG. 7(c) records net optical density at 630 nm versus electron dosage at 30 kV. Curve A—250 na, 0.4 µm address size, Curve B—75 na, 0.2 µm address size, EVC—e-beam flood exposure.

FIG. 7(c) exhibits the corresponding net optical density values at 630 nm as a function of electron dosage at 30 kv.

Figure 7:
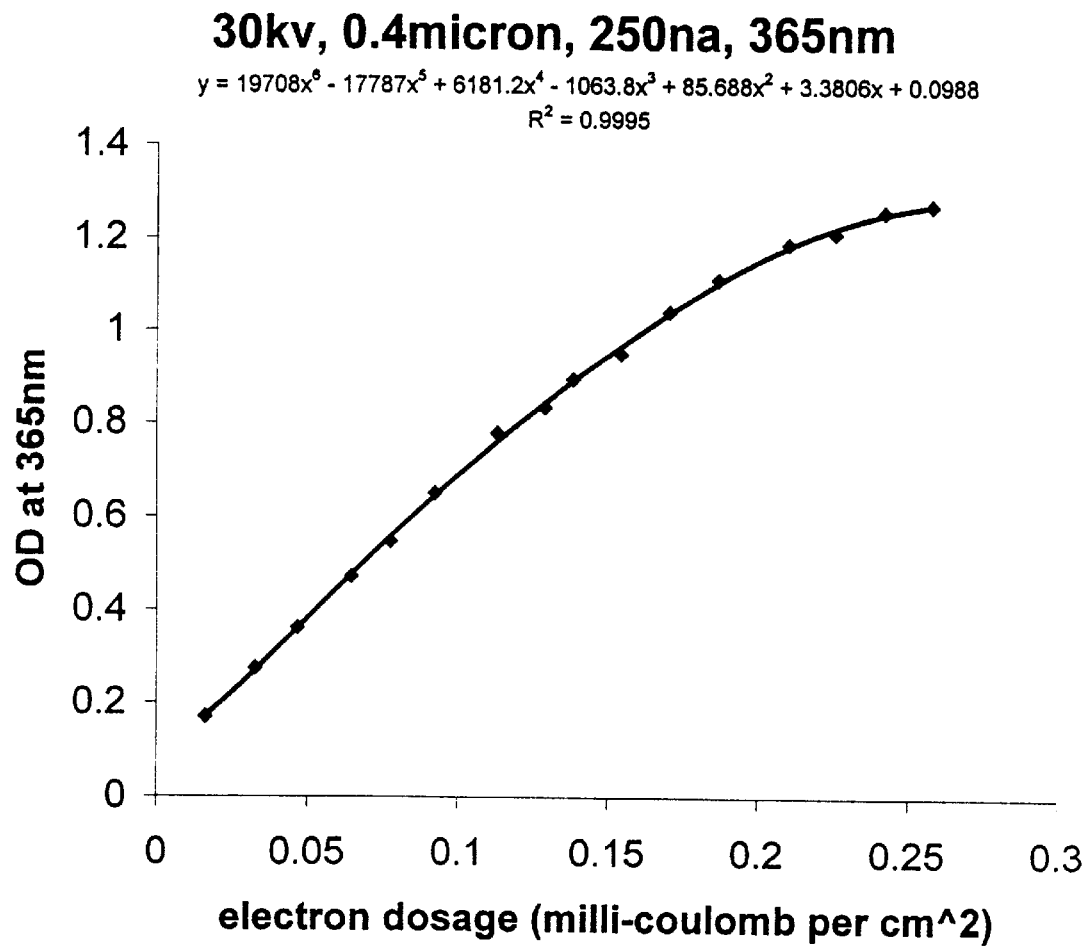
FIG. 7(d) records data points of the net optical density at 365 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 µm. In the equation, Y represents the net optical density at 365 nm and X represents values of electron dosage in milli-coulomb/cm$^2$.
FIG. 7(e) records data points of the net optical density at 435 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 µm. In the equation, Y represents the net optical density at 435 nm and X represents values of electron dosage in milli-coulomb/cm$^2$.
FIG. 7(f) records data points of the net optical density at 530 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 µm. In the equation, Y represents the net optical density at 530 nm and X represents values of electron dosage in milli-coulomb/cm$^2$.
FIG. 7(g) records data points of the net optical density at 630 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 µm. In the equation, Y represents the net optical density at 630 nm and X represents values of electron dosage in milli-coulomb/cm$^2$.
Figure 7:
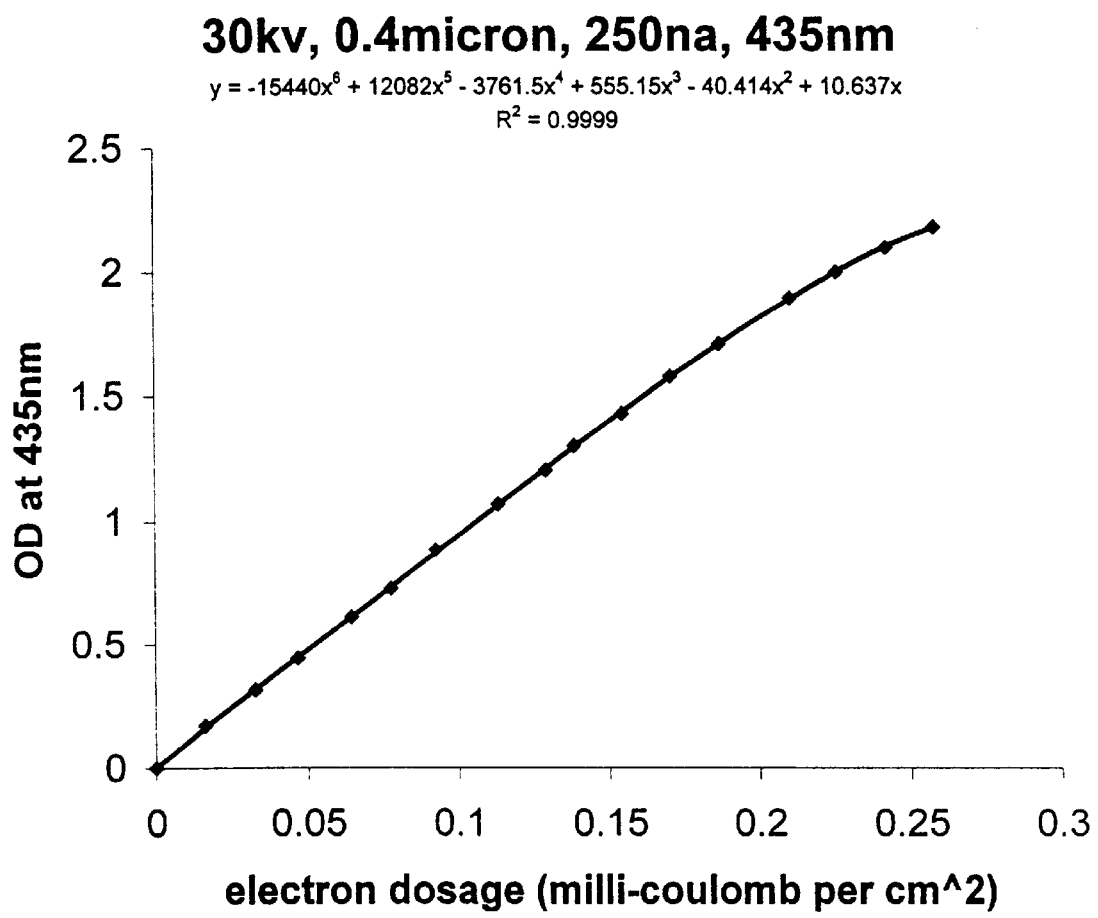
Figure 7:
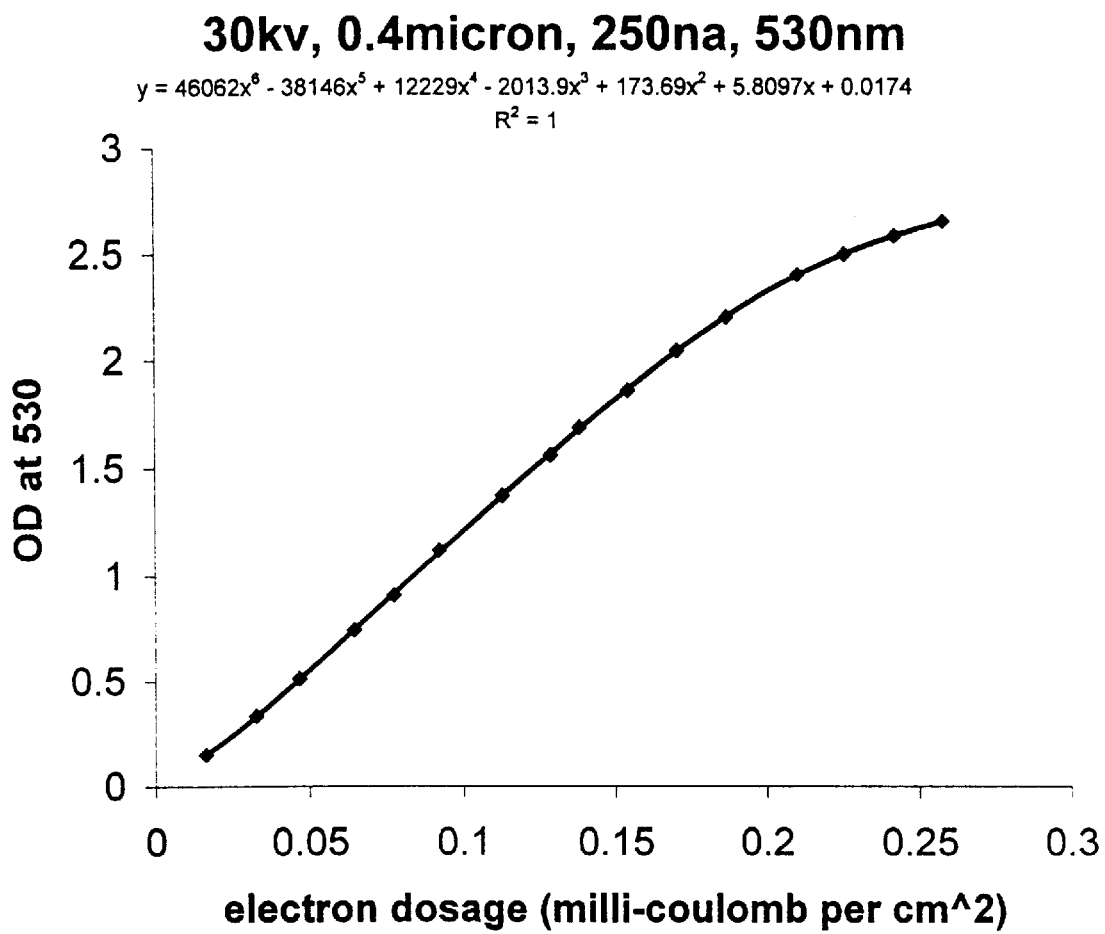
Figure 7:
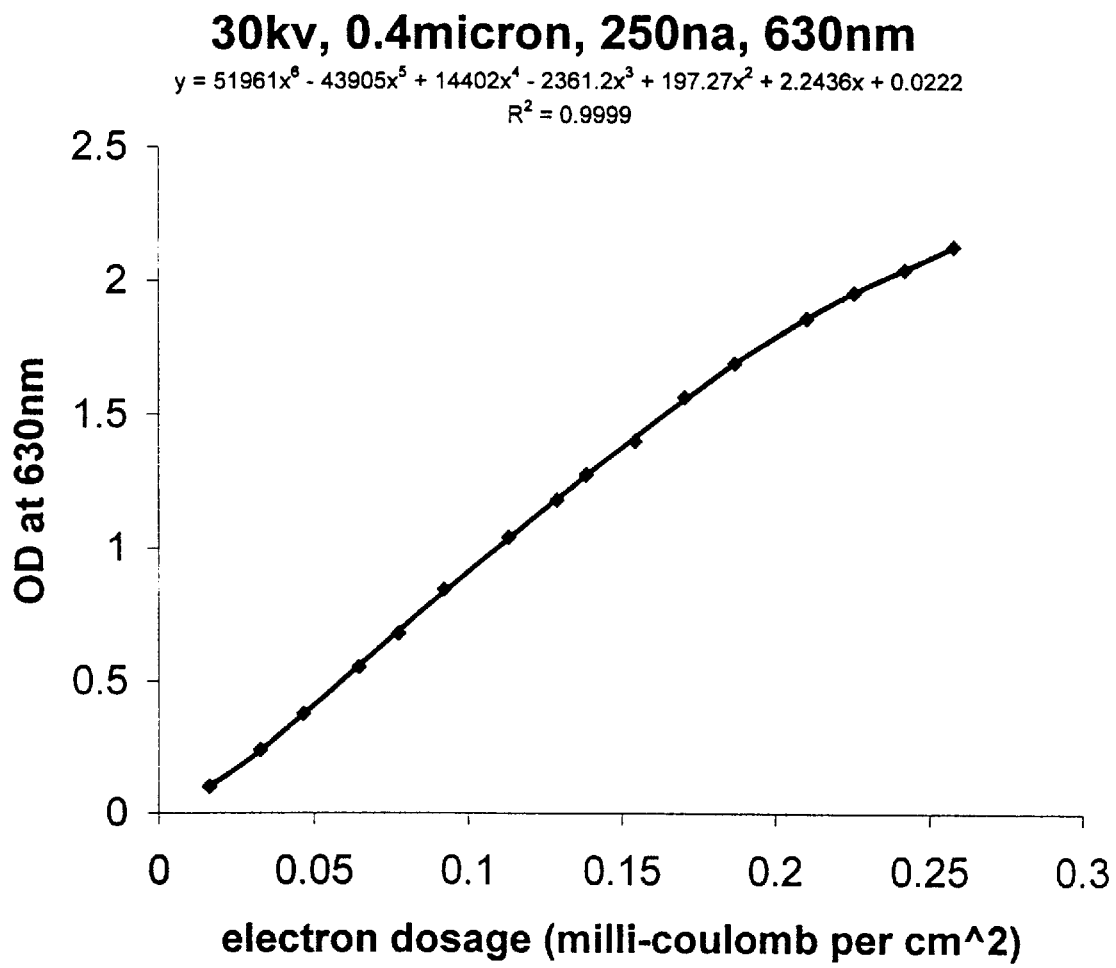

The data points of curve A in FIG. 7 are listed in Table 1. Also listed in Table 1 is the net optical density values at 365 nm. The electron dosage in $\mu$ Coulomb/cm$^2$ and in milli Coulomb/cm$^2$, the clock rates and the corresponding e-beam exposure durations per address to result in the tabulated electron dosages are also listed in the table.

The best fit polynomial equations that depict the experimental data of net optical density vs. electron dosage in milli coulomb/cm$^2$ of Table 1 are shown in FIG. 7(d), FIG. 7(e), FIG. 7(f) and FIG. 7(g) respectively for the net optical density values at 365 nm, 435 nm, 530 nm and 630 nm respectively. In the equations, y represents net optical density values and x represents values of electron dosage in milli coulomb/cm$^2$. The experimental data points and the best fitted curves are also shown in FIGS. 7(d), 7(e), 7(f), and 7(g).

As shown in FIG. 7(d), a large portion of the best fit curve is a straight line. The linear portion ranges in net optical density values from 0 to 0.9. The slope of the linear portion representing the e-beam sensitivity of HEBS-glass No. 3 darkening at the spectral wavelength of 365 nm upon e-beam exposure with write parameters of 30 kV acceleration voltage, 250 nano-amp beam current, and 0.4 $\mu$m addressing grid size, is 6.2767 unit of optical density value per milli coulomb/cm$^2$. Namely to obtain a net optical density value of 0.62767 at 365 nm, the required electron dosage is 100 micro-coulomb/cm$^2$.

As shown in FIG. 7(e), a large portion of the best fit curve is a straight line. The linear portion ranges in net optical density values from 0 to 1.65. The slope of the straight line portion representing the e-beam sensitivity of HEBS-glass No. 3 darkening at the spectral wavelength of 435 nm upon e-beam exposure with write parameters of 30 kV acceleration voltage, 250 nano-amp beam current, and 0.4 $\mu$m addressing grid size, is 9.2113 unit of optical density value per milli coulomb/cm$^2$. Namely to obtain a net optical density value of 0.92113 at 435 nm, the required electron dosage is 100 micro-coulomb/cm$^2$.

As shown in FIG. 7(f), a large portion of the best fit curve is a straight line. The linear portion ranges in net optical density values from 0 to 2.05. The slope of the linear portion representing the e-beam sensitivity of HEBS-glass No. 3 darkening at the spectral wavelength of 530 nm upon e-beam exposure with write parameters of 30 kV acceleration voltage, 250 nano-amp beam current, and 0.4 $\mu$m addressing grid size, is 12.507 unit of optical density value per milli coulomb/cm². Namely to obtain a net optical density value of 1.2507 at 530 nm, the required electron dosage is 100 micro-coulomb/cm².

As shown in FIG. 7(g), a large portion of the best fit curve is a straight line. The linear portion ranges in net optical density values from 0 to 1.7. The slope of the linear portion representing the e-beam sensitivity of HEBS-glass No. 3 darkening at the spectral wavelength of 630 nm upon e-beam exposure with write parameters of 30 kV acceleration voltage, 250 nano-amp beam current, and 0.4 μm addressing grid size, is 9.5929 unit of optical density value per milli coulomb/cm². Namely to obtain a net optical density value of 0.95929 at 630 nm, the required electron dosage is 100 micro-coulomb/cm².

Electron beam pattern generators were employed to darken HEBS-glass No. 3 at a number of electron dosage each of the best fit curves of net optical density values at 365 nm, at 435 nm, at 530 nm and 630 nm vs. electron dosage are represented in Table 2.

Figure 8:
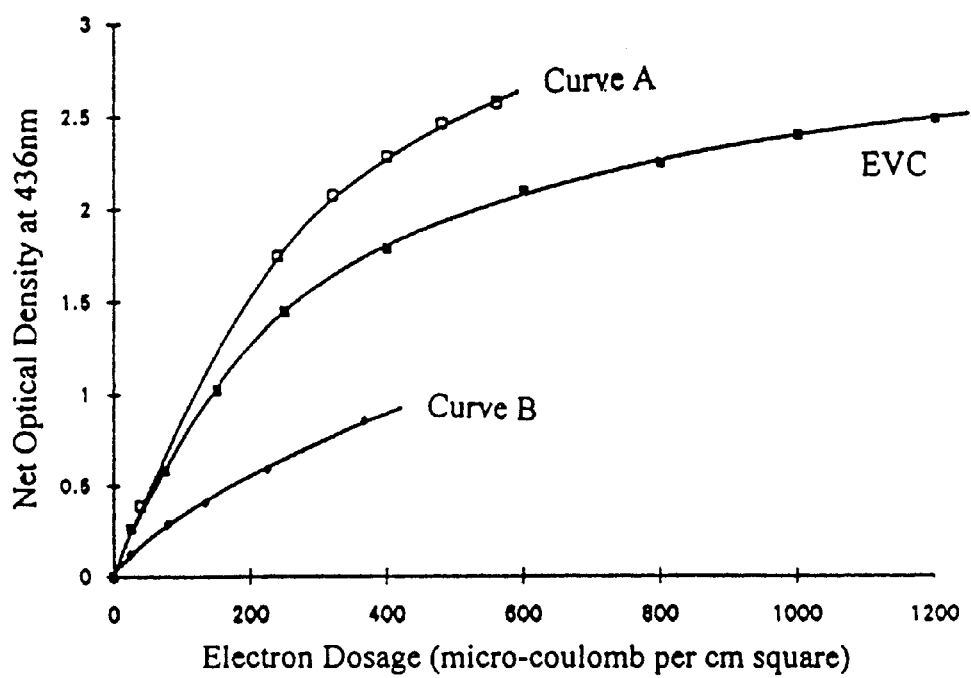
FIG. 8 records net optical density at 436 nm versus electron dosage at 20 kV. Curve A—MEBES III, 4000 na, 0.5 µm address size, 40 MHz. Curve B—Cambridge EBMF 10.5, 25 na, 0.1 µm address size. EVC—e-beam flood exposure.

FIG. 8 exhibits net optical density values of HEBS-glass No. 3 at 436 nm vs. electron dosage at 20 kv. Curve A displays the data of e-beam exposure using the raster scan e-beam pattern generator, MEBES III. MEBES III was operated at 20 kv, 40 MHz rate, using a spot size of 1 μm, a beam current of 4000 na and an addressing grid size of 0.5 μm. These write parameters result in an exposure dosage of 40 μC/cm² per scan count. Electron dosage having multiples of 40 μC/cm² were

TABLE 1

Net optical density in HEBS-glass having been exposed to e-beam at 30 kv, 250 na beam current, 0.4 μm addressing grid size using Cambridge EBMF 10.5 e-beam writer at various clock rates.

| Exposure Duration per pixel (micro sec) | Clock Rate (MHz) | Electron Dosage (micro C/cm²) | Electron Dosage (milli C/cm²) | Net Optical Density at 365 nm | Net Optical Density at 435 nm | Net Optical Density at 530 nm | Net Optical Density at 630 nm |
|---|---|---|---|---|---|---|---|
| 0.1039 | 9.625 | 16.23 | 0.01623 | 0.170 | 0.172 | 0.149 | 0.100 |
| 0.2091 | 4.782 | 32.67 | 0.03267 | 0.275 | 0.317 | 0.336 | 0.242 |
| 0.2984 | 3.351 | 46.63 | 0.04663 | 0.362 | 0.445 | 0.514 | 0.377 |
| 0.4126 | 2.424 | 64.47 | 0.06447 | 0.472 | 0.613 | 0.744 | 0.553 |
| 0.4956 | 2.018 | 77.44 | 0.07744 | 0.547 | 0.729 | 0.909 | 0.681 |
| 0.5966 | 1.676 | 93.22 | 0.09322 | 0.651 | 0.883 | 1.120 | 0.846 |
| 0.7236 | 1.382 | 113.06 | 0.11306 | 0.779 | 1.068 | 1.373 | 1.041 |
| 0.8248 | 1.212 | 128.88 | 0.12888 | 0.835 | 1.202 | 1.563 | 1.180 |
| 0.8855 | 1.129 | 138.36 | 0.13836 | 0.894 | 1.297 | 1.689 | 1.273 |
| 0.9870 | 1.013 | 154.22 | 0.15422 | 0.950 | 1.427 | 1.862 | 1.401 |
| 1.0900 | 0.917 | 170.31 | 0.17031 | 1.041 | 1.574 | 2.045 | 1.566 |
| 1.1940 | 0.838 | 186.56 | 0.18656 | 1.111 | 1.706 | 2.203 | 1.690 |
| 1.3445 | 0.744 | 210.08 | 0.21008 | 1.189 | 1.892 | 2.404 | 1.859 |
| 1.4430 | 0.693 | 225.47 | 0.22547 | 1.212 | 1.998 | 2.500 | 1.955 |
| 1.5474 | 0.646 | 241.78 | 0.24178 | 1.258 | 2.095 | 2.583 | 2.042 |
| 1.6485 | 0.607 | 257.58 | 0.25758 | 1.272 | 2.180 | 2.652 | 2.126 | levels using beam acceleration voltages, beam current, beam spot size and addressing grid size as variable parameters. Beam acceleration voltages ranging from 10 kV to 50 kV, beam spot size ranging from 0.1 μm to 1 μm, beam current ranging from 10 na to 8000 na, and addressing grid size ranging from 0.05 μm to 1 μm were studied to determine the practical and cost effective write schemes for HEBS-glass compositions. Experimental data of net optical density in the spectral range of 350 nm to 1100 nm and polynomial equations together with the best fit curves resembling FIGS. 7(d) to 7(g) as well as the slope of the linear portion of the best fit curves were obtained for a number of combinations of e-beam writer parameters. It has been determined that the exemplary write schemes using EBMF 10.5 e-beam writer, which are practical and cost effective to make HEBS-glass gray level masks include (1) 30 kV, 0.4 μm address, 250 na; (2) 30 kV, 0.2 μm address, 150 na; (3) 30 kV, 0.2 μm address, 125 na; (4) 30 kV, 0.2 μm address, 100 na; (5) 30 kV, 0.2 μm address, 75 na; (6) 20 kV, 0.2 μm address, 175 na; (7) 20 kV, 0.2 μm address, 150 na; (8) 20 kV, 0.2 μm address, 125 na; (9) 20 kV, 0.2 μm address, 100 na; and (10) 20 kV, 0.1 μm address, 25 na. Using each of the ten write schemes listed immediately above net optical density values of HEBS-glass NO.3 at wavelengths from 350 nm to 1100 nm were obtained as a function of the electron dosage. The best fit polynomial equations and the slope of the linear portion of exposed on HEBS-glass using the number of scan counts as a variable parameter. The data points of Curve A corresponds to 1, 6, 8, 10, 12, and 14 scan counts. Curve B displays the data of e-beam exposure using Cambridge EBMF 10.5 e-beam writer operated at 20 kv, 25 na and 0.1 μm addressing grid spacing. Also shown in FIG. 8 for comparison is the net optical density values at 436 nm resulting from EVC flood gun exposure at 20 kv.

The effect of retraces as well as the dependence of e-beam induced optical density on the variable write parameters of Table 2 are explained in the section "Heat effect of the Write e-beam" in light of a postulated mechanism of e-beam darkening.

Figure 9:
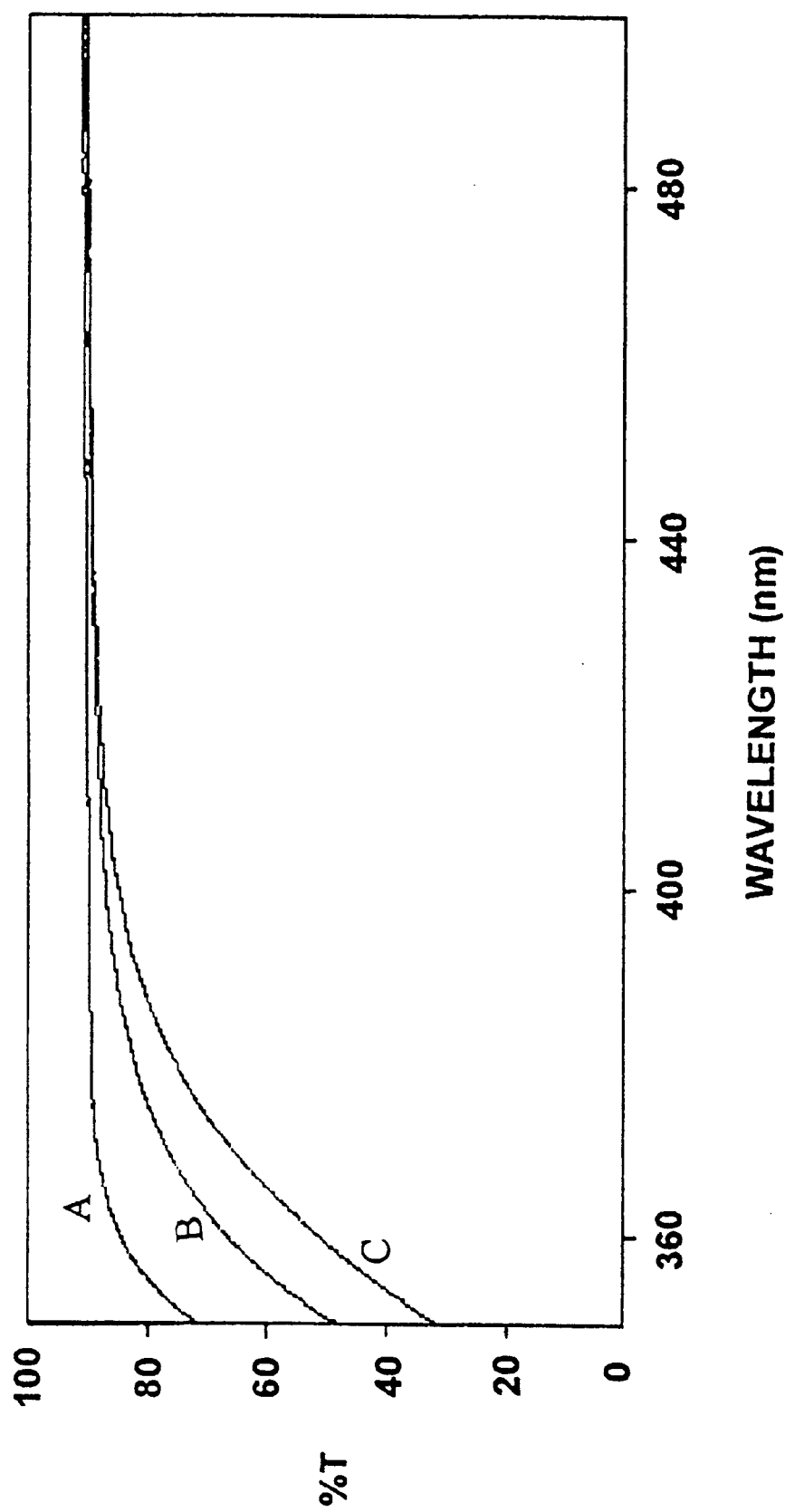
FIG. 9 depicts the transmittance spectra of exemplary HEBS-glass No. 3. A—a base glass plate, 0.090" thick; B—a HEBS-glass plate 0.086" thick having one ion-exchanged surface glass layer; C—a HEBS-glass plate 0.090" thick having two ion-exchanged surface glass layer.

FIG. 9 exhibits the transmittance spectra of the base glass plate 0.090 inch thick of the exemplary glass composition No. 3. The cut off in transmittance i.e., the absorption edge of the base glass is due to electronic transitions of the constituting chemical elements of the base glass. As the concentration of the doping with photo inhibitors increases, the absorption edge of the base glass shifts to longer wavelengths; namely %T of the base glass reduces in the spectral range of uv, then near uv and then blue light as the doping concentration of photo inhibitors increases. The concentration of photo inhibitors in the exemplary base glass compositions of Exhibit A was optimized for use at mercury G-line so that the HEBS-glass is totally inert to actinic radiation having wavelengths λ equal to or longer than 436 nm, and has a %T value of more than 88%. The %T values of the exemplary HEBS-glass No. 3 is shown in FIG. 9 and Table 3. A value of 88% transmittance corresponds to 96% internal transmission, since reflection less from two glass surfaces is 8%. The values of %T and the internal transmission of the corresponding base glass 0.090 inch thick are more than 90% and more than 98% respectively for λ≧436 nm.

A HEBS-glass plate in general consists of two ion-exchanged surface glass layers, since both surfaces of a base glass plate were ion exchanged during an ion exchange process. To increase the transmittance of the HEBS-glass plate at λ<436 nm one may grind off one ion-exchanged surface glass layer and polish the now anhydrous surface to photomask quality. The transmittance spectra of HEBS-glass No. 3, 0.086" thick having only one ion-exchanged surface is also shown in FIG. 9.

TABLE 2

The best polynomial fit equation and the slope of the linear portion of an electron beam darkening sensitivity curve

| Write Scheme No. and Equation No. | parameters of write schemes | | | | Electron Beam Darkening Sensitivity Curve Y = Optical Density X = Electron Dosage In milli coulomb/cm2 | Slope of the linear portion of the Sensitivity Curve |
|---|---|---|---|---|---|---|
| | Acceleration voltage (kV) | Addressing grid size (micron) | Beam Current (na) | Wavelength (nm) | | |
| 1 | 30 | 0.4 | 250 | 365 | $y = 19708x^6 - 17787x^5 + 6181.2x^4 - 1063.8x^3 + 85.688x^2 + 3.3806x$ | 6.2767 |
| 2 | 30 | 0.4 | 250 | 435 | $y = -15440x^6 + 12082x^5 - 3761.5x^4 + 555.15x^3 - 40.414x^2 + 10.637x$ | 9.2113 |
| 3 | 30 | 0.4 | 250 | 530 | $y = 46062x^6 - 38146x^5 + 12229x^4 - 2013.9x^3 + 173.69x^2 - 5.8097x$ | 12.507 |
| 4 | 30 | 0.4 | 250 | 630 | $y = 51961x^6 - 43905x^5 + 14402x^4 - 2361.2x^3 + 197.27x^2 + 2.2436x$ | 9.5929 |
| 5 | 30 | 0.2 | 75 | 365 | $y = 4788.8x^6 - 4881.1x^5 + 1822.8x^4 - 308.43x^3 + 19.251x^2 + 4.098x$ | 4.3024 |
| 6 | 30 | 0.2 | 75 | 435 | $y = 3780.7x^6 - 4395.5x^5 + 1959x^4 - 421.14x^3 + 40.268x^2 + 4.882x$ | 6.1553 |
| 7 | 30 | 0.2 | 75 | 530 | $y = 4227.3x^6 - 4897.4x^5 + 2192.6x^4 - 490.42x^3 + 50.025x^2 + 6.8341x$ | 8.6203 |
| 8 | 30 | 0.2 | 75 | 630 | $y = 3750.9x^6 - 4226.7x^5 + 1854.8x^4 - 408.5x^3 + 41.902x^2 + 4.8131x$ | 3.4022 |
| 9 | 30 | 0.2 | 100 | 365 | $y = -355.78x^6 + 466.62x^5 - 243.17x^4 + 62..851x^3 - 12.485x^2 + 5.5571x$ | 4.424 |
| 10 | 30 | 0.2 | 100 | 435 | $y = -692.18x^6 + 804.39x^5 - 358.96x^4 + 75.143x^3 - 10.535x^2 + 6.9982x$ | 6.1269 |
| 11 | 30 | 0.2 | 100 | 530 | $y = -175.37x^6 + 38.823x^5 + 112.01x^4 - 80.56x^3 + 14.073x^2 + 7.6867x$ | 8.3914 |
| 12 | 30 | 0.2 | 100 | 630 | $y = -839.24x^6 + 947.64x^5 - 359.07x^4 + 40.139x^3 - 0.7855x^2 + 6.4234x$ | 6.3643 |
| 13 | 30 | 0.2 | 125 | 365 | $y = -664.62x^6 + 932.44x^5 - 464.2x^4 + 95.04x^3 - 13.314x^2 + 6.4665x$ | 5.392 |
| 14 | 30 | 0.2 | 125 | 435 | $y = -900.79x^6 + 1480.9x^5 - 905.98x^4 + 243.25x^3 - 32.801x^2 + 9.8528x$ | 7.7152 |
| 15 | 30 | 0.2 | 125 | 530 | $y = -1283.3x^6 + 1929.4x^5 - 1020x^4 + 210.47x^3 - 22.431x^2 + 12.109x$ | 10.672 |
| 16 | 30 | 0.2 | 125 | 630 | $y = 111.03x^6 - 345.7x^5 + 352.69x^4 - 158.9x^3 + 24.867x^2 + 6.7982x$ | 8.1056 |
| 17 | 30 | 0.2 | 150 | 365 | $y = -104.68x^6 + 149.86x^5 - 51.158x^4 - 8.925x^3 - 0.3208x^2 + 5.866x$ | 5.4107 |
| 18 | 30 | 0.2 | 150 | 435 | $y = -341.18x^6 + 643.91x^5 - 430.4x^4 + 115.13x^3 - 16.314x^2 + 9.1502x$ | 7.8427 |
| 19 | 30 | 0.2 | 150 | 530 | $y = -237.51x^6 + 304.15x^5 - 52.05x^4 - 65.071x^3 + 15.235x^2 + 10.164x$ | 11.048 |
| 20 | 30 | 0.2 | 150 | 630 | $y = 225.42x^6 - 507.45x^5 + 442.41x^4 - 182.81x^3 + 27.586x^2 + 6.9154x$ | 3.8774 |
| 30 | 20 | 0.2 | 100 | 365 | $y = 1165x^6 - 1729.1x^5 + 969.72x^4 - 255.38x^3 + 28.215x^2 + 1.9949x$ | 3.1561 |
| 22 | 20 | 0.2 | 100 | 435 | $y = 321.26x^6 - 495.79x^5 + 299.53x^4 - 93.047x^3 + 11.878x^2 + 3.99x$ | 4.4463 |
| 23 | 20 | 0.2 | 100 | 530 | $y = 530.82x^6 - 893.24x^5 + 604.38x^4 - 205.16x^3 - 28.195x^2 + 4.3652x$ | 5.7739 |
| 24 | 20 | 0.2 | 100 | 630 | $y = 747.21x^6 - 1197.4x^5 + 741.5x^4 - 217.47x^3 + 24.784x^2 + 2.8845x$ | 3.8774 |
| 25 | 20 | 0.2 | 125 | 365 | $y = -454.78x^6 + 748.41x^5 - 467.28x^4 + 137.8x^3 - 22.463x^2 + 4.8643x$ | 3.0043 |
| 26 | 20 | 0.2 | 125 | 435 | $y = -399.43x^6 + 659.66x^5 - 409.6x^4 + 113.52x^3 - 15.916x^2 + 5.6722x$ | 4.5474 |
| 27 | 20 | 0.2 | 125 | 530 | $y = -46.317x^6 - 22.298x^5 + 112.29x^4 - 77.504x^3 + 13.876x^2 + 5.0038x$ | 5.7824 |
| 28 | 20 | 0.2 | 125 | 630 | $y = 417.51x^6 - 711.04x^5 + 469.27x^4 - 145.5x^3 + 16.454x^2 + 3.218x$ | 3.8464 |
| 29 | 20 | 0.2 | 150 | 365 | $y = -74.993x^6 + 118.24x^5 - 57.174x^4 + 5.249.2x^3 - 0.6172x^2 + 3.3699x$ | 3.2267 |
| 30 | 20 | 0.2 | 150 | 435 | $y = -278.14x^6 + 503.66x^5 - 329.14x^4 + 89.552x^3 -$ | 4.7421 |

TABLE 2-continued

The best polynomial fit equation and the slope of the linear portion of an electron beam darkening sensitivity curve

| Write Scheme No. and Equation No. | parameters of write schemes | | | | Electron Beam Darkening Sensitivity Curve $Y = $ Optical Density $X = $ Electron Dosage In milli coulomb/cm2 | Slope of the linear portion of the Sensitivity Curve |
|---|---|---|---|---|---|---|
| | Acceleration voltage (kV) | Addressing grid size (micron) | Beam Current (na) | Wavelength (nm) | | |
| 31 | 20 | 0.2 | 150 | 530 | $y = 3.461x^6 - 102.55x^5 + 172.08x^4 - 102.48x^3 + 11.422x^2 + 5.4742x$ $18.951x^2 + 4.8104x$ | 5.872 |
| 32 | 20 | 0.2 | 150 | 630 | $y = 161.84x^6 - 348.51x^5 + 286.3x^4 - 107.41x^3 + 13.817x^2 + 3.2921x$ | 3.8027 |
| 33 | 20 | 0.2 | 175 | 365 | $y = 7.7262x^6 - 37.019x^5 + 56.546x^4 - 35.995x^3 + 6.9532x^2 + 2.7738x$ | 3.1017 |
| 34 | 20 | 0.2 | 175 | 435 | $y = 45.959x^6 - 160.56x^5 + 213.4x^4 - 135.08x^3 + 37.556x^2 + 0.3871x$ | 4.6256 |
| 35 | 20 | 0.2 | 175 | 530 | $y = 82.35x^6 - 237.03x^5 + 259.77x^4 - 130.11x^3 + 23.171x^2 + 4.6292x$ | 6.0434 |
| 36 | 20 | 0.2 | 175 | 630 | $y = 138.78x^6 - 316.52x^5 + 272.92x^4 - 106.53x^3 + 14.299x^2 + 3.2743x$ | 3.7417 |
| 37 | 20 | 0.1 | 25 | 365 | $y = -257.78x^6 + 493.22x^5 - 357.35x^4 + 125.26x^3 - 24.07x^2 + 4.2726x$ | 2.454 |
| 38 | 20 | 0.1 | 25 | 435 | $y = -421.26x^6 + 736.88x^5 - 503.36x^4 + 168.42x^3 - 30.486x^2 + 5.7851x$ | 3.5813 |
| 39 | 20 | 0.1 | 25 | 530 | $y = 55.321x^6 - 40.121x^5 - 7.75x^4 + 13.643x^3 - 8.1316x^2 + 5.4291x$ | 4.7759 |
| 40 | 20 | 0 1 | 25 | 630 | $y = -199.22x^6 + 369.63x^5 - 264.28x^4 + 94.119x^3 - 20.554x^2 + 4.7848x$ | 2.9976 |

The internal transmittance of one ion exchanged surface glass layer was measured by placing the HEBS-glass plate 0.086" thick with one ion exchanged surface in the sample beam of the U2000 spectrophotometer and placing a base glass plate 0.090 inch thick in the reference beam. The internal transmittance from 350 nm to 500 nm of the ion exchanged glass layer of the exemplary HEBS-glass No. 3 is listed in Table 3.

Also listed in Table 3 are the corresponding transmittance values of the base glass plate 0.090 inch thick, the HEBS-glass plate 0.090 inch thick having two ion exchanged surface glass layers (i.e. 2 IEed surfaces) and the HEBS-glass plate 0.086" thick having one ion exchanged surface glass layers (i.e. 1 IEed surface).

Accelerated test on stability of HEBS-glass No. 3 under intense actinic exposure at 436 nm was carried out. HEBS-glass No. 3, 0.090 inch thick, having a transmittance value of 89.2% was exposed for a duration of 30 days to 586 milli watt/cm² light intensity at 436 nm from the output actinic radiation of a 200 watt mercury arc lamp, the actinic radiation being filtered with an interference filter and focused to a spot of 5 mm diameter. The transmittance value remains constant at 89.2% before and after the intense G-line exposure for 30 days.

From accelerated tests using focused 365 nm radiation from the 200 watt mercury arc lamp, it has been determined that the residual sensitivity of the exemplary HEBS-glass No. 3 to I-line at 365 nm is not detectable for optical lithographic exposure of less than about one million I-line stepper exposures.

The grayscale mask made of HEBS-glass No. 3 can in general be employed in I-line as well as G-line optical lithographic exposure systems.

An exchange of $H^+$ and/or $H_3O^+$ ions for alkali metal ions takes place concurrently with the exchange of $Ag^+$ ions for alkali-metal ions when HEBS-glass is ion exchanged in an acidic aqueous solution containing silver ions. As a result, $H^+$ and/or $H_3O^+$ ions entered into the silicate glass network and silanol groups SiOH formed in the glass network. The formation of the silanol groups in a silicate glass network is referred to as hydration of glass. HEBS-glass was hydrated, and a moving boundary type concentration profile formed. When water species are among the diffusion species in glass, the diffusion of water species (i.e.,$H^+$ and/or $H_3O^+$) and $Ag^+$ ions through a hydrated layer is accompanied by an instantaneous and irreversible immobilization of the diffusion species at the boundary surface. The moving boundary type diffusion profile is due to the fact that the diffusion coefficient of $H^+$, $H_3O^+$ and $Ag^+$ in the hydrated layer is many order of magnitude larger than that in the anhydrous base glass.

An essential feature of diffusion accompanied by an instantaneous and irreversible immobilization of the diffusion species is that a sharp boundary surface moves through the medium, separating a region in which all of the sites are occupied from one in which none are occupied. In front of the advancing boundary the concentration of freely diffusing species is zero whereas behind it immobilization is complete.

FIG. 1 is a qualitative representation of the result of silver ion exchange of HEBS-glass in an acidic aqueous solution containing soluble ionic silver. There exists a leached surface glass layer, $x_1$ in thickness, wherein essentially all of the alkali ions are leached out instead of being exchanged by $Ag^+$ ions. The leached surface glass layer is essentially fused silica in composition and contains little or no mobile ions such as sodium, potassium and lithium ions. The exemplary HEBS-glass No. 3 have a leached surface glass layer of less than about 0.5 μm, i.e., $x_1 < 0.5$ μm and has an e-beam sensitized glass layer of 3 μm, i.e., $x_2 - x_1 = 3$ μm. HEBS-glass photomask blanks having an e-beam sensitized glass layer ($x_2 - x_1$) of 2 μm, 4 μm, 5 μm and other thickness' were fabricated by controlling the ion exchange duration and/or heat schedules.

By controlling the operation parameters of the solution ion exchange reactions, the thickness of the e-beam sensitized glass layer can be controlled precisely.

Heat Effect of the Write E-Beam

The net optical density is a function of the e-beam exposure scheme and the e-beam write parameters. This is because the e-beam sensitivity of HEBS-glass is enhanced by the heating effect of the write beam. Listed in Exhibit B is the input-power density from e-beam exposure for the three exposure schemes of FIG. 8, where input-power density is equal to (beam current)×(beam acceleration voltage)/(beam spot size).

The rate of temperature increase at the beam exposure spot i.e. the e-beam exposed volume of HEBS-glass, is proportional to the net power density which is defined herein as the rate of input-power density minus the rate of heat dissipation. The rate of heat dissipation is larger for a smaller exposed volume corresponding to a smaller beam spot size. This is because the ratio of surface area to mass is larger for a smaller volume. The rate of heat dissipation relative to the rate of input-power density, together with the corresponding beam spot size are also listed in Exhibit B.

Comparing the write parameters that we employed using MEBES III with those of Cambridge EBMF 10.5. It is apparent from Exhibit B that the net power density of the MEBES exposure scheme is a factor of 10 to 100 times that of the Cambridge exposure scheme (20 kV, 0.1 $\mu$m address, 0.25 $\mu$m spot size, 25 na). The very big difference in heat accumulation between the above described exposure parameters of MEBES III and Cambridge EBMF 10.5 should contribute to the observed difference in the e-beam induced optical density.

The following hypothesis explains the reason why the e-beam sensitivity of HEBS-glass is enhanced by the heat effect of the write beam. During e-beam exposure, silver specks of atomic dimensions were formed from silver halide-alkali halide complex crystals. The formation of a silver speck consisting of 2, 3, or more atoms requires the deformation of silver halide lattice to silver lattice. Cycles of lattice vibration of sufficient amplitude is necessary to cause the formation of the silver specks. Since larger amplitudes of lattice vibrational modes exist at higher temperatures, silver specks are formed more quickly at a higher temperature. Each retrace (i.e. each scan count) allows an extended time period for the formation of the silver specks.

The e-beam sensitivity of HEBS-glass using the exposure scheme of the EVC flood exposure system is further elaborated below. Although the input-power density of EVC exposure scheme is very little compared, to that of Cambridge EBMF 10.5, the rate of heat dissipation during EVC exposure is very small relative to the input-power density, due to the enormous beam exposure spot size of 8 inches. Therefore, a large fraction of the input-power density is accumulated throughout the flood exposure duration. Moreover, HEBS-glass was under EVC flood gun exposure for a long duration of e.g. 10 minutes which corresponds to 600×10$^{12}$ periods of lattice vibration. There is thus plenty of time for the deformation of silver halide lattice into silver lattice.

For the choice of write parameters using any e-beam writer to write a gray level mask it is helpful to consider the HEBS-glass properties which are summarized immediately below. HEBS-glass is more sensitive using a larger beam current density and a larger beam spot size, since the sensitivity is enhanced by the heating effect of the write beam. At a given current density, a larger spot size is beneficial since heat dissipation is slower. Using a high kV beam and a spot size of up to about 0.2 $\mu$m, the resolution of the recorded image in HEBS-glass is primarily determined by the scattering of the electrons in glass. To a certain extent, one can increase both the spot size and the beam current to maximize the throughput without the adverse effect of reducing resolution.

A much larger beam current density than that normally used in exposing photoresist can be employed and is recommended for e-beam write on HEBS-glass.

Using a vector scan e-beam writer, a large range of available clock rates is the key factor to produce a large optical density range of gray levels. The maximum clock rate of an e-beam writer is employed to produce the minimum optical density level of the gray levels. The larger the maximum clock rate the higher the currant density that can be employed and therefore higher throughput.

When a vector scan e-beam writer has a limited range of useful clock rates, one retrace (i.e. two scan counts) can be utilized to double the optical density values for all phase levels provided the linear region of the sensitivity curve is utilized.

Number of retraces can be employed as a variable parameter using a raster scan e-beam writer. For example, 16 phase levels can be obtained using 1 to 16 scan counts, namely, using 1 scan count to expose the lowest optical density level and using 16 scan counts to write the highest optical density level.

TABLE 3

Transmittance Values (% T) of HEBS-glass No. 3

| Wavelength (nm) | base glass 0.090" (% T) | HEBS-glass 2 IEed Surface (% T) | HEBS-glass 1 IEed Surface (% T) | Internal Transmittance of an IEed glass layer (% T) |
|---|---|---|---|---|
| 500.0 | 91.2 | 90.6 | 90.5 | 100 |
| 495.0 | 91.0 | 90.5 | 90.2 | 100 |
| 490.0 | 91.0 | 90.6 | 90.2 | 100 |
| 485.0 | 91.0 | 90.4 | 90.3 | 100 |
| 480.0 | 90.9 | 90.2 | 90.0 | 100 |
| 475.0 | 90.8 | 90.4 | 90.0 | 100 |
| 470.0 | 90.7 | 89.9 | 89.9 | 100 |
| 465.0 | 90.7 | 89.9 | 89.7 | 100 |
| 460.0 | 90.6 | 89.9 | 89.7 | 100 |
| 455.0 | 90.6 | 89.6 | 89.7 | 100 |

TABLE 3-continued

Transmittance Values (% T) of HEBS-glass No. 3

| Wavelength (nm) | base glass 0.090" (% T) | HEBS-glass 2 IEed Surface (% T) | HEBS-glass 1 IEed Surface (% T) | Internal Transmittance of an IEed glass layer (% T) |
|---|---|---|---|---|
| 450.0 | 90.5 | 89.6 | 89.4 | 100 |
| 445.0 | 90.4 | 89.4 | 89.4 | 100 |
| 440.0 | 90.4 | 89.2 | 89.3 | 100 |
| 435.0 | 90.4 | 89.2 | 89.1 | 99.9 |
| 430.0 | 90.2 | 88.6 | 89.0 | 99.9 |
| 425.0 | 90.2 | 88.6 | 88.8 | 99.6 |
| 420.0 | 90.1 | 88.0 | 88.7 | 99.6 |
| 415.0 | 90.0 | 87.6 | 88.3 | 99.3 |
| 410.0 | 89.9 | 86.9 | 88.0 | 99.0 |
| 405.0 | 89.9 | 86.1 | 87.6 | 98.7 |
| 400.0 | 89.9 | 84.9 | 87.0 | 98.1 |
| 395.0 | 89.7 | 83.3 | 86.3 | 97.4 |
| 390.0 | 89.7 | 81.3 | 85.3 | 96.3 |
| 385.0 | 89.5 | 78.7 | 83.9 | 94.9 |
| 380.0 | 89.4 | 75.0 | 82.1 | 92.7 |
| 375.0 | 89.1 | 71.2 | 79.9 | 90.5 |
| 370.0 | 88.4 | 65.7 | 76.8 | 87.6 |
| 365.0 | 87.1 | 59.1 | 72.3 | 83.7 |
| 360.0 | 84.7 | 51.2 | 66.7 | 79.1 |
| 355.0 | 80.0 | 41.9 | 58.8 | 73.6 |
| 350.0 | 71.6 | 31.3 | 48.2 | 66.9 |

Although the e-beam sensitivity of HEBS-glass is a function of the exposure scheme and write parameters, e-beam induced optical density in the HEBS-glass is a unique function of electron dosage for a given set of write parameters. Therefore, the net optical density versus electron dosage is very reproducible.

Exhibit B Input-power density and rate of heat dissipation.

|  | Input-Power Density (Watt/cm$^2$) | Beam Spot Size | Relative Rate of Heat Dissipation |
|---|---|---|---|
| MEBES III 1 scancount | $8 \times 10^6$ | 1 $\mu$m | Small |
| Cambridge EBMF 10.5 | $8 \times 10^5$ | 0.25 $\mu$m | Large |
| EVC | 0.1 | 8 inch | Very small |

Coloring Speck of Silver

Upon e-beam exposure coloring specks of silver are formed in the HEBS-glass. Since there are no chemical or physical development steps, the silver specks are of atomic dimensions and the image has no graininess. The recorded image has a continuous tone even when observed at the highest magnification under microscope e.g. 1500×. On the contrary, at this high magnification the image in a conventional high resolution photographic emulsion plate is intrinsically halftone, because isolated grains of photographic emulsion plates resembling dispersed halftone dots exist at gray levels of low optical density values.

Sub 0.25 Micrometer Resolution

Since there is no graininess, HEBS-glass is capable of very high resolution. Sub 0.25 $\mu$m features were written in the exemplary HEBS-glasses of Exhibit A.

Vertical resist profile exists at the boundary of sub micron resist features which were printed using HEBS-glass masks.

HEBS-Glass Gray Scale Masks with Multi-Gray Levels

Figure 10:
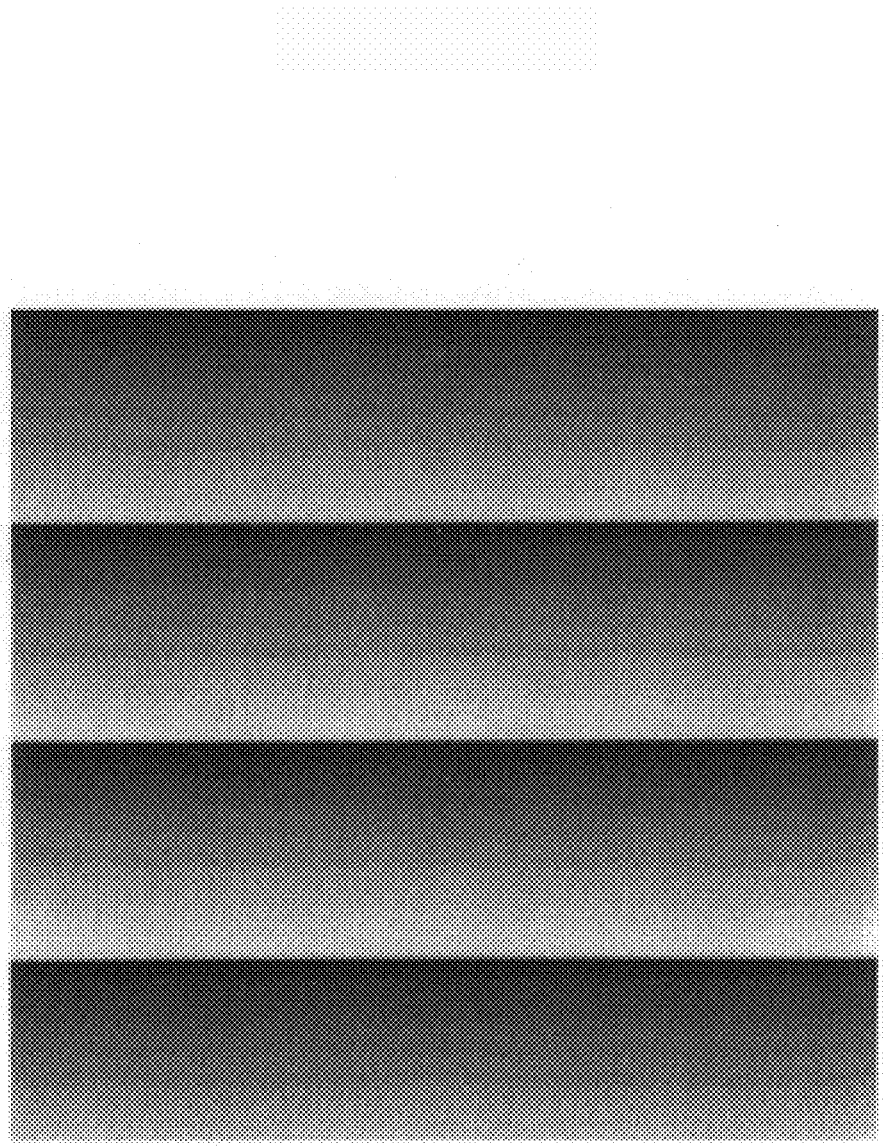
FIG. 10 exhibits an optical micrograph of a gray scale mask which is a grating in HEBS-glass No. 3. The grating has 250 gray levels within a period of 200 µm.

FIG. 10 exhibits an optical micrograph of a gray scale mask which is a grating in HEBS-glass No.3 The grating has 250 gray levels within a period of 200 micrometers. A Cambridge EBMF 10.5 e-beam writer operated at 20 kV, 0.2 $\mu$m addressing grid size and 100 na beam current, was employed to fabricate the grating with 250 predetermined optical density values. The maximum and minimum optical density value are 1.6 and 0.149 respectively. The gray levels have an equal interval of transmittance, namely the values of the transmittance T corresponding to 250 gray levels are $Ti = 0.709578 - (0.684459/249)i$ Where i=0, 1, 2, - - - to 249

The gradual and smooth increase in the transmittance within each grating period seen in FIG. 10 should result in analog resist profile having smooth continuous blaze surfaces.

Figure 11:
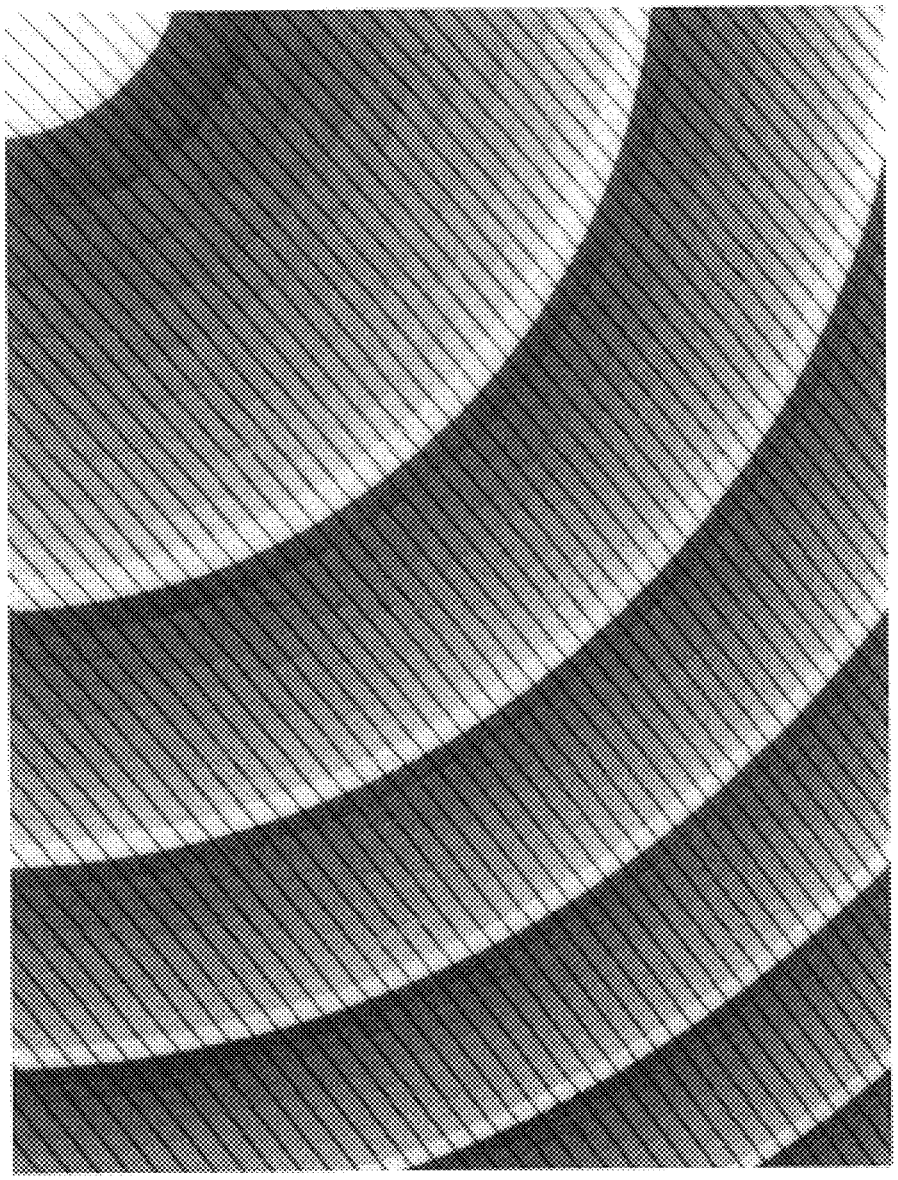
FIG. 11 exhibits an optical micrograph of a portion of a gray scale mask which is a diffractive optical lens having ten gray levels in each zone.

FIG. 11 exhibits an optical micrograph of a portion of a gray scale mask made of HEBS-glass No. 3. The primary mask pattern is a diffractive optical lens having ten gray levels in each zone. The width of 5 complete zones represented in the photo are 920 $\mu$m, 500 $\mu$m, 390 $\mu$m, 330 $\mu$m and 290 $\mu$m. Ten gray levels in the range of 0 to 1.0 unit of optical density values, were written in HEBS-glass No. 3 using Cambridge EBMF 10.5 e-beam writer operated at 20 kv acceleration voltage, 0.2 $\mu$m addressing grid size and 150 na beam current. It is seen in FIG. 11, as the zone width reduces from 920 $\mu$m the discreet gray levels become less apparent.

A second pattern which consists of parallel lines with a 42 $\mu$m pitch was written within the lens pattern to demonstrate that a predetermined optical density value can be added to the existing mask pattern in HEBS-glass. Since the parallel lines was written with a constant e-beam dosage, the optical density along each lines increases as it enters into a darker gray level of the lens pattern.

One of the products of the present invention is a transparent HEBS-glass which in bodies of 0.090 inch cross section will exhibit the following properties:

(a) the transmittance is more than 88% at 436 nm (b) upon exposure to an electron beam with an electron beam pattern generator operated at a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/cm$^2$.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another of the product of the present invention is a transparent HEBS-glass which in bodies of 0.090 inch cross section will exhibit the following properties:

(a) the transmittance is more than 88% at 436 nm (b) upon exposure to an electron beam using an electron beam pattern generator operated with a write scheme having a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/cm$^2$. The write scheme is selected from the write schemes of Table 2, said electron beam darkening sensitivity of the HEBS-glass is substantially represented by the sensitivity curve corresponding to that of the chosen write scheme of Table 2.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 30 kV, an addressing grid size of 0.4 micrometer and a beam current of 250 na will darken to a net optical density value Y at 365 nm substantially in accordance with the equation stated immediately below;

$$Y=19708x^6-17787x^5+6181.2x^4-1063.8x^3+85.688x^2+3.3806x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 30 kV, an addressing grid size of 0.4 micrometer and a beam current of 250 na will darken to a net optical density value Y at 435 nm substantially in accordance with the equation stated immediately below;

$$Y=-15440x^6+12082x^5-3761.5x^4+555.15x^3-40.414x^2+10.637x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 30 kV, an addressing grid size of 0.4 micrometer and a beam current of 250 na will darken to a net optical density value Y at 530 nm substantially in accordance with the equation stated immediately below;

$$Y=46062x^6-38146x^5+12229x^4-2013.9x^3+173.69x^2+5.8097x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 30 kV, addressing grid size of 0.4 micrometer and a beam current of 250 na will darken to a net optical density value Y at 630 nm substantially in accordance with the equation stated immediately below;

$$Y=51961x^6-43905x^5+14402x^4-2361.2x^3+197.27x^2+2.2436x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.1 micrometer and a beam current of 25 na will darken to a net optical density value Y at 365 nm substantially in accordance with the equation stated immediately below;

$$Y=-257.78x^6+493.22x^5-357.35x^4+125.26x^3-24.07x^2+4.2726x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.1 micrometer and a beam current of 25 na will darken to a net optical density value Y at 435 nm substantially in accordance with the equation stated immediately below;

$$Y=-421.26x^6+736.88x^5-503.36x^4+168.42x^3-30.486x^2+5.785x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.1 micrometer and a beam current of 25 na will darken to a net optical density value Y at 530 nm substantially in accordance with the equation stated immediately below;

$$Y=55.321x^6-40.121x^5-7.75x^4+13.643x^3-8.1316x^2+5.4291x$$

Said HEBS-glass having a base glass composition consisting essentially on the mole % oxide basis 1 1.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 20 kV, an addressing grid size of 0.1 micrometer and a beam current of 25 na will darken to a net optical density value Y at 630 nm substantially in accordance with the equation stated immediately below;

$$Y=-199.22x^6+369.63x^5-264.28x^4+94.119x^3-20.554x^2+4.7848x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 30 kV, an addressing grid size of 0.2 micrometer and a beam current of 75 na will darken to a net optical density value Y at 365 nm substantially in accordance with the equation stated immediately below;

$$Y=4788.8x^6-4881.1x^5+1822.8x^4-308.43x^3+19.251x^2+4.098x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 30 kV, an addressing grid size of 0.2 micrometer and a beam current of 75 na will darken to a net optical density value Y at 435 nm substantially in accordance with the equation stated immediately below;

$$Y=3780.7x^6-4395.5x^5+1959.1x^4-421.14x^3+40.268x^2+4.882x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 30 kV, an addressing grid size of 0.2 micrometer and a beam current of 100 na will darken to a net optical density value Y at 365 nm substantially in accordance with the equation stated immediately below;

$$Y=-355.78x^6+466.62x^5-243.17x^4+62.851x^3-12.485x^2+5.5571x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 30 kV, an addressing grid size of 0.2 micrometer and a beam current of 100 na will darken to a net optical density value Y at 435 nm substantially in accordance with the equation stated immediately below;

$$Y=-692.18x^6+804.39x^5-358.96x^4+75.143x^3-10.535x^2+6.9982x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in milli coulomb/cm$^2$ of electron dosage with an electron beam writer operated at a beam acceleration voltage of 30 kV, an addressing grid size of 0.2 micrometer and a beam current of 125 na will darken to a net optical density value Y at 365 nm substantially in accordance with the equation stated immediately below;

$$Y=-664.62x^6+932.44x^5-464.2x^4+95.04x^3-13.314x^2+6.4665x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:
(a) the transmittance is more than 88% at 436 nm
(b) upon exposure to a value X in mini coulomb/cm$^2$ of electron dosage with an electron beam writer operated at a beam acceleration voltage of 30 kV, an addressing grid size of 0.2 micrometer and a beam current of 125 na will darken to a net optical density value Y at 435 nm substantially in accordance with the equation stated immediately below;

$$Y=-900.79x^6+1480.9x^5-905.98x^4+243.25x^3-32.801x^2+9.8528x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value, X in milli coulomb/$cm^2$ of electron dosage with an electron beam writer operated at a beam acceleration voltage of 30 kV, an addressing grid size of 0.2 micrometer and a beam current of 150 na will darken to a net optical density value Y at 365 nm substantially in accordance with the equation stated immediately below;

$$Y=-104.68x^6+149.86x^5-51.158x^4-8.925x^3-0.3208x^2+5.866x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 30 kV, an addressing grid size of 0.2 micrometer and a beam current of 150 na will darken to a net optical density value Y at 435 nm substantially in accordance with the equation stated immediately below;

$$Y=-341.18x^6+643.91x^5-430.4x^4+115.13x^3-16.314x^2+9.1502x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 100 na will darken to a net optical density value Y at 365 nm substantially in accordance with the equation stated immediately below;

$$Y=1165x^6-1729.1x^5+969.72x^4-255.38x^3+28.215x^2+1.9949x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 100 na will darken to a net optical density value Y at 435 nm substantially in accordance with the equation stated immediately below;

$$Y=321.26x^6-495.79x^5+299.53x^4-93.047x^3+11.878x^2+3.99x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 125 na will darken to a net optical density value Y at 365 nm substantially in accordance with the equation stated immediately below;

$$Y=-454.78x^6+748.41x^5-467.28x^4+137.8x^3-22.463x^2+4.8643x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 125 na will darken to a net optical density value Y at 435 nm substantially in accordance with the equation stated immediately below;

$$Y=-399.43x^6+659.66x^5-409.6x^4+113.52x^3-15.916x^2+5.6722x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 150 na will darken to a net optical density value Y at 365 nm substantially in accordance with the equation stated immediately below;

$$Y=-74.993x^6+118.24x^5-57.174x^4+5.2492x^3-0.6172x^2+3.3699x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 150 na will darken to a net optical density value Y at 435 nm substantially in accordance with the equation stated immediately below;

$$Y=-278.14x^6+503.66x^5-329.14x^4+89.552x^3-11.422x^2+5.4742x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 175 na will darken to a net optical density value Y at 365 nm substantially in accordance with the equation stated immediately below;

$$Y=7.7262x^6-37.019x^5+56.546x^4-35.995x^3+6.9532x^2+2.7738x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/$cm^2$ of electron dosage with an electron beam writer operated at a beam acceleration voltage of 20 kV, an addressing grid size of 0.2 micrometer and a beam current of 175 na will darken to a net optical density value Y at 530 nm substantially in accordance with the equation stated immediately below;

$$Y=82.35x^6-237.03x^5+259.77x^4-130.11x^3+23.171x^2+4.6292x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

The products of the present invention described above have utility in making a gray scale mask with multi-gray levels, each of said gray levels having a predetermined optical density value which is obtained through exposure to a predetermined electron dosage, said gray scale mask can be utilized in making three dimensional microstructures with general three dimensional surfaces in photoresist through a single optical exposure in a photolithographic process.

The profile of a three dimensional surface is transferred into a substrate material using an etching process.

For example, one of the products of the present invention is a transparent HEBS-glass which in bodies of 0.090 inch cross section will exhibit the following properties:

(a) the transmittance is more than 88% at 436 nm (b) upon exposure to an electron beam with an electron beam pattern generator operated at a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/$cm^2$.

Said HEBS-glass having a base glass composition consisting essentially on the mole % oxide basis 11.4 to 17.5% of one or more alkali: metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$ has utility in making a gray scale mask with multi-gray levels, each of said gray levels having a predetermined optical density value which is obtained through exposure to a predetermined electron dosage, said gray scale mask can be utilized in making three dimensional microstructures with general three dimensional surfaces in photoresist through a single optical exposure in a photolithographic process.

Cost Efficient Mass Fabrication of Diffractive Optical Elements (DOEs)

HEBS-glass is a mask material sensitive towards e-beam exposure, and exposure with a certain electron beam dosage changes the optical density of the material. After e-beam exposure the mask needs no further development or fixation process. The mask with multi levels of optical densities can then be used to expose a photo resist in a contact aligner or in a reduction stepper. This allows to associate a certain resist thickness after development with each optical density. The information was used to determine the e-beam dosages for each of the (e.g. 32) phase levels necessary to generate a Diffractive Optical Elements (DOE herein after). The so generated HEBS-glass gray level mask can be used to expose numerous DOEs using an optical lithography tool. After many copies of the mask on the photo resist are developed, many substrates with the developed photo resist are placed in a Chemically Assisted Ion Beam Etching (CAIBE) system, to simultaneously transfer the microstructures from the analog resists onto the surfaces of the substrates. An overview of these processing steps is shown in FIG. 12.

Figure 12:
FIG. 12 illustrates that the processing steps necessary to generate Diffractive Optical Elements consisting of (a) a HEBS-glass photo mask blank being exposed in e-beam writer (b) gray level mask generated in HEBS-glass (c) photoresist exposure in optical lithography tool (d) resist surface profile after development (e) surface profile in substrate material after CAIBE transfer step.
Figure 12:
Figure 12:
Figure 12:
Figure 12:

The fabrication of DOE arrays using a HEBS-glass gray scale mask with multi gray levels and the process steps of FIG. 12 was described in "cost-effective mass fabrication of multi-level diffractive optical elements by use of a single optical exposure with a gray scale mask on high-energy beam sensitive glass" Applied. Optics, Jul. 10, 1997/Vol. 36, No. 20 by Walter Daschner, Pin Long, Robert Stein, Che-Kuang (Chuck) Wu and S. H. Lee.

The described fabrication method shows the cost effective mass fabrication of DOEs. There are a number of advantages:

The mass fabrication is simplified and more cost-effective. Instead of a set of masks (i.e. 5 masks for 32 phase levels) with all the associated resist processing, only a single mask needs to be exposed in the e-beam writer and no resist processing is associated with the mask generation. Phase levels of DOE are immediately visible as gray levels in HEBS-glass upon e-beam exposure.

All phase levels are written in a single step on a single mask. The inevitable mis-registrations and associated efficiency losses between subsequent exposures are avoided.

Third, the number of processing steps for the DOE fabrication compared to binary mask fabrication of e.g. 32 phase levels is reduced by a factor of 5. This will reduce the cost for high quality monolithic DOEs substantially.

Fourth, even with a binary fabrication method for master fabrication and a following replication step based on injection molding this replication method only becomes economic with a number of DOEs to be fabricated in the 10's of thousands. Since the proposed fabrication method greatly reduces the involved fabrication steps resulting in a cost reduction, the number at which molding based methods become economically feasible will grow considerably. This will allow to avoid the problems associated with the molding approach. The material which is best suited for the application, can be chosen without being limited by the constraints of the molding material (i.e. limited temperature range of operation or limited wavelength range). Also all the involved materials and tools are compatible with VLSI fabrication so that no new fabrication or software tools need to be established unlike in the case of replication by injection molding or casting.

There is a considerable gain in turn around time since the number of production steps has been reduced and the mask fabrication steps have been simplified.

Cost Efficient Mass Fabrication of Asymmetric Irregularly Shaped Micro-Lens Arrays A cost-effective way of fabricating large arrays of refractive micro lenses becomes more and more important. Gray level mask fabrication offers the possibility to shape arbitrary resist profiles and therefore produce arrays of general aspheric non rotationally symmetric refractive lenses with different functionality, complete aberration correction and a 100% fill-factor. The fabrication method based on HEBS-glass gray level mask allows for complete freedom in terms of the shapes e.g. asymmetric, irregularly shaped lenses, and location of the lenses e.g. with accurate center to center spacing.

As the resist for the lithography step a comparatively thick photoresist can be employed in order to achieve a resist thickness in the range of up to 30 microns. This feature depth in resist will allow for a total lens sag after the etching transfer of up to about 120 microns, since a magnification of the feature depth of about a factor of 3 to 5 can be achieved during the transferring step of resist profiles into their respective substrates via Chemically Assisted Ion Beam Etching (CAIBE). The described fabrication steps are shown in FIG. 13.

Figure 13:
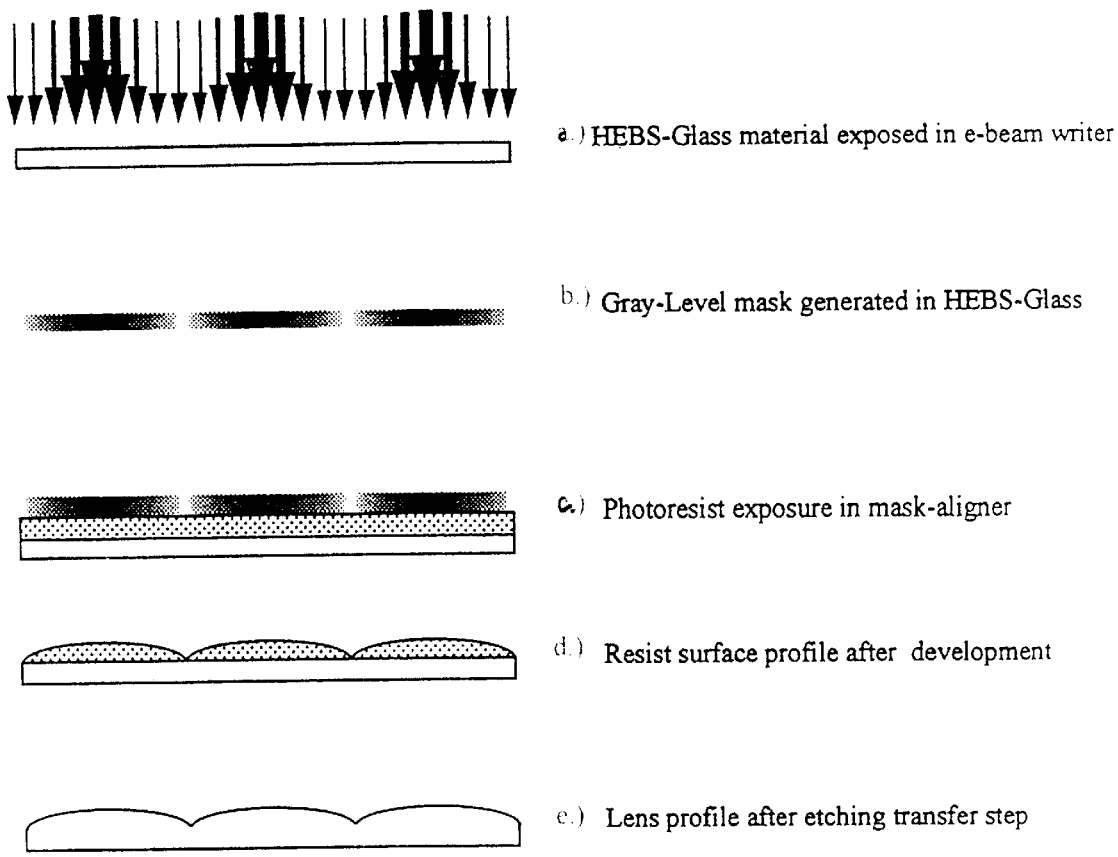
FIG. 13 illustrates that the processing steps to fabricate refractive lens arrays consisting of (a) a HEBS-glass photo mask blank being exposed in e-beam writer (b) gray level mask generated in HEBS-glass (c) photoresist exposure in mask aligner (d) resist surface profile after development (e) lens profile after etching transfer step.

For the analog transfer scheme of FIG. 13, i.e. from an optical density profile in the gray-level mask into a surface height profile in the photoresist, it is necessary that the number of gray levels be increased as the aperture of the refractive lens increases; for example, HEBS-glass masks having a minimum of 32, 64, and 96 gray levels are desirable to fabricate refractive micro lenses having apertures of 50 $\mu$m, 100 $\mu$m, and 200 $\mu$m, respectively.

The fabrication of refractive microlens arrays using a HEBS-glass gray level mask and the processing steps of FIG. 13 was described in "General aspheric refractive micro-optics fabricated by optical lithography using a high energy beam sensitive glass gray-level mask" J. Vac. Sci. Technol. B 14 (6), November/December 1996 by Walter Daschner, Pin Long, Robert Stein, Che-kuang (Chuck) Wu and S. H. Lee.

The Analog Transfer Scheme Using HEBS-glass Gray Scale Masks

It has been determined that the procedures of processing photoresist to produce analog resist profile can be derived from those normally used for binary photo lithography with the following modifications and provisions:

1. positive and non chemically amplified Novalac based photoresist is preferred
2. prebake photoresist at a low temperature and for a shortened time duration from that is normally used for binary lithography
3. use a weak developer, or dilute the usual developers for example, by a factor of 4.

Exemplary Calibration Curves (a) Surface height versus optical density, i.e. the calibration curve of the analog transfer scheme.

Figure 14:
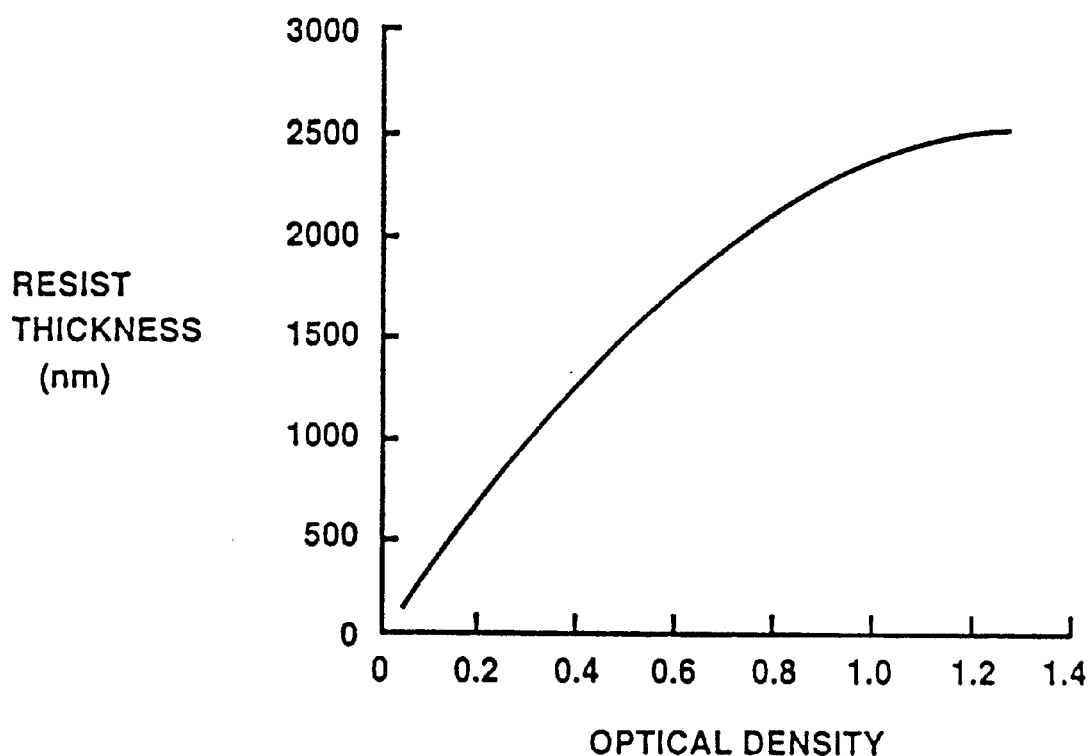
FIG. 14 depicts the thickness of Shipley S1650 Photoresist versus optical density at 436 nm of HEBS-glass mask; photoresist was exposed in an optical contact aligner.

FIG. 14 shows the remaining thickness after development of Shipley S1650 photoresist as a function of the optical density at 436 nm of the gray levels in a HEBS-glass mask. The initial (i.e. as coated) thickness of the Shipley S1650 photoresist was 4.0 $\mu$m. The range of resist thickness in the depth versus optical density calibration curve can be altered through the choice of a photoresist and/or resist parameters, the initial thickness of the photoresist in particular. In the plots of resist thickness versus optical density, the slope of the calibration curve reduces as the developed resists thickness approaches the initial (as coated) resists thickness. Therefore, to produce an analog resist profile of a given feature depth, it is necessary to start with an as coated resist thickness which is more than that of its required feature depth.

To transfer multilevel resist structure of DOE into quartz through a dry etching process, the relative etch rate between photoresist and quartz substrate can be so chosen to achieve the final needed etch depth 3 to 6 times that in the resist. Therefore, for the fabrication of DOE in quartz, a surface height variation of e.g. 500 nm in the resist results in a depth modulation in quartz of up to 3000 nm.

(b) Electron beam darkening sensitivity curve (Optical density versus electron dosage).

Table 2 list, FIG. 7 and FIG. 8 depict the exemplary e-beam darkening sensitivity curves of HEBS-glass No.3. For DOE fabrication the required optical density values of a HEBS-glass gray level mask are typically in the range of 0.1 to 1.2.

For the fabrication of refractive micro lens arrays, the optical density levels in a HEBS-glass gray level mask is in general in the range of 0 to more than 1.2. The maximum optical density value is larger to produce a larger lens-sag.

(c) Optical density versus clock rate, i.e. the calibration curve of e-beam exposure.

The electron dosage D in micro coulomb/$cm^2$ is calculated as follows:

$$D(\mu c/cm^2)=I\cdot t\cdot N=I\cdot N/f$$

Where I is bean current in amp., t is exposure duration i.e. dwell time per pixel in $\mu$sec, and N is number of pixels in 1 $cm^2$. The exposure duration per pixel is equal to 1/f, where f is the clock rate i.e. the write frequency. Since the clock rate can be varied on the fly using a vector scan e-beam writer, the calibration curve of e-beam exposure "optical density versus clock rate" is a practical one for a vector scan e-beam writer. The calibration curve was determined experimentally for each combination of write parameters which include beam acceleration voltage, beam current and addressing grid size.

Figure 15:
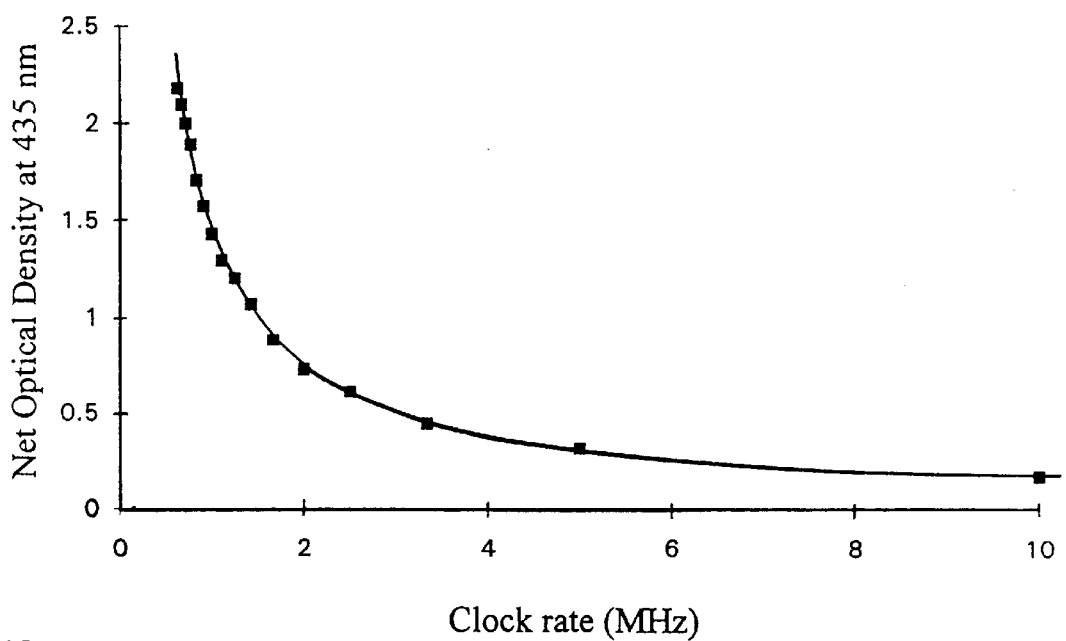
FIG. 15 records the calibration curve "net optical density at 435 nm versus clock rate" of e-beam exposure at 30 kv using Cambridge EBMF 10.5 e-beam writer with 250 na beam current and 0.4 μm addressing grid size.
Figure 16:
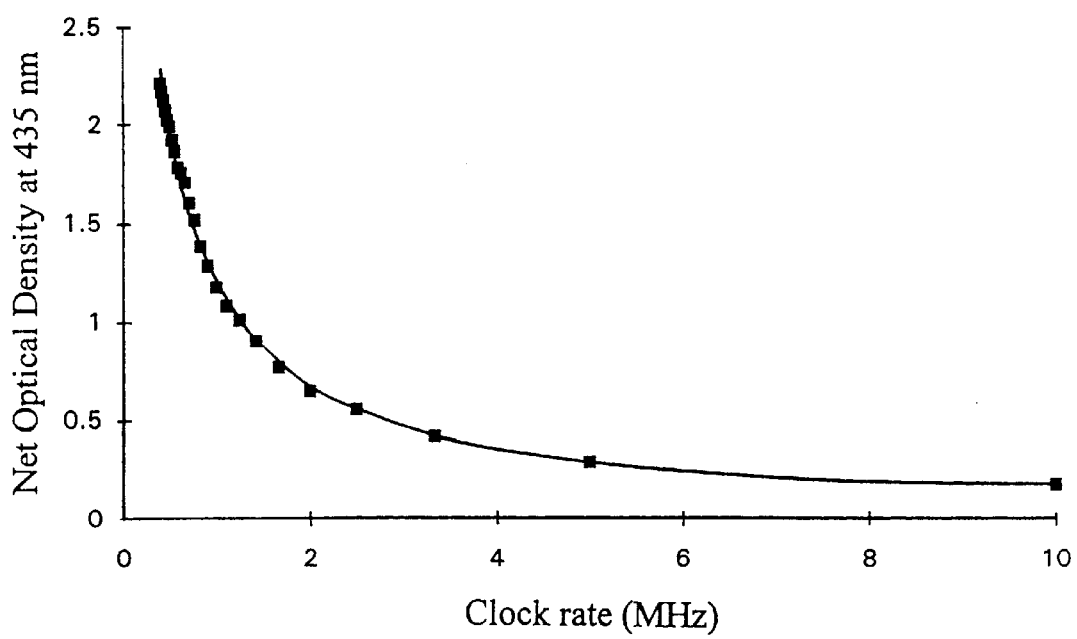
FIG. 16 records the calibration curve "net optical density at 435 nm versus clock rate" of e-beam exposure at 30 kv using Cambridge EBMF 10.5 e-beam writer with 75 na beam current and 0.2 μm addressing grid size.

The net optical density values at 435 nm and the corresponding clock rates are plotted in FIG. 15 and FIG. 16 for two write scheme using the data of Table 1 and Table 2. FIG. 15 exhibits the calibration curve "net optical density versus clock rate" for the e-beam write scheme of 30 kv, 250 na beam current and 0.4 $\mu$m addressing grid size. FIG. 16 displays the calibration curve "net optical density versus clock rate" for the e-beam write scheme of 30 kv, 75 na beam current and 0.2 $\mu$m addressing grid size.

Fabrication of HEBS-glass Gray Level Masks

A HEBS-glass photomask with multi-gray levels is ideally suited for fabrication of diffractive optical elements (DOE), refractive micro optics, micro-electro-mechanical (MEM) devices, micro-opto-electro-mechanical (MOEM) devices and integrated optical components, and for beam shaping optics.

A mask for multi phase levels of DOE is made by exposing in an e-beam writer with predetermined dosages according to a calibration curve of the analog transfer scheme such as that shown in FIG. 14 together with the e-beam darkening sensitivity curve, examples of which are listed in Table 2.

To make a HEBS-glass gray level mask using a vector scan e-beam writer, optical density levels which will achieve evenly spaced multi depth levels over the thickness range of photoresist needed for a subsequent dry etching, are determined from a calibration curve of the analog transfer scheme e.g. FIG. 14. Each optical density level in the mask is then written with a clock rate corresponding to the predetermined optical density value. The clock rate is determined from the calibration curve of e-beam exposure such as that shown in FIG. 15 and FIG. 16. The calculation of the clock rate is further elaborated below.

The clock rates f were calculated from polynomial equations such as eq. A and eq. B for a large number of the predetermined optical density levels of gray level mask designs. Eq. A and eq. B are the best polynomial fit equations of the experimental data.

$$1/f=0.0692D^6-0.4299D^5+1.0403D^4-1.2009D^3+0.666D^2+0.5339D \quad A$$

$$1/f=0.012D^6-0.0862D^5+0.304D^4-0.5256D^3+0.5491D^2+0.5622D \quad B$$

Figure 17:
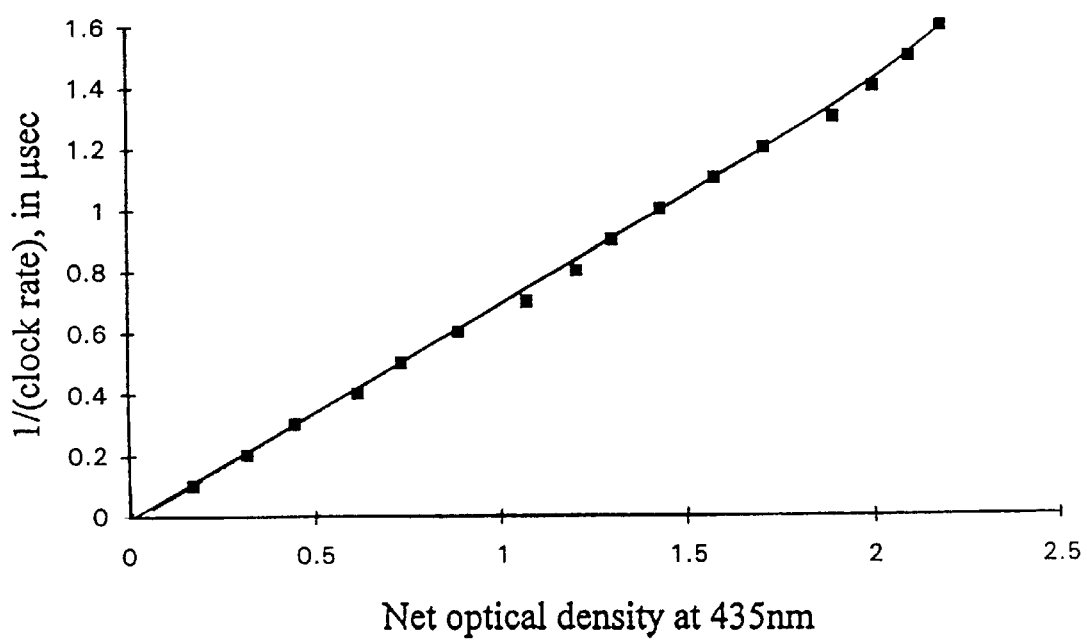
FIG. 17 records the calibration curve "1/(clock rate) versus net optical density at 435 nm" of e-beam exposure at 30 kv using Cambridge EBMF 10.5 e-beam writer with 250 na beam current and 0.4 μm addressing grid size.

Plotted the experimental data of Table 1, FIG. 17 exhibits the calibration curve "1/(clock rate) versus net optical density at 435 nm" for the e-beam write scheme of 30 kv, 250 na beam current and 0.4 $\mu$m addressing grid size. Eq. A is the best polynomial fit equation of the data points of FIG. 17.

Figure 18:
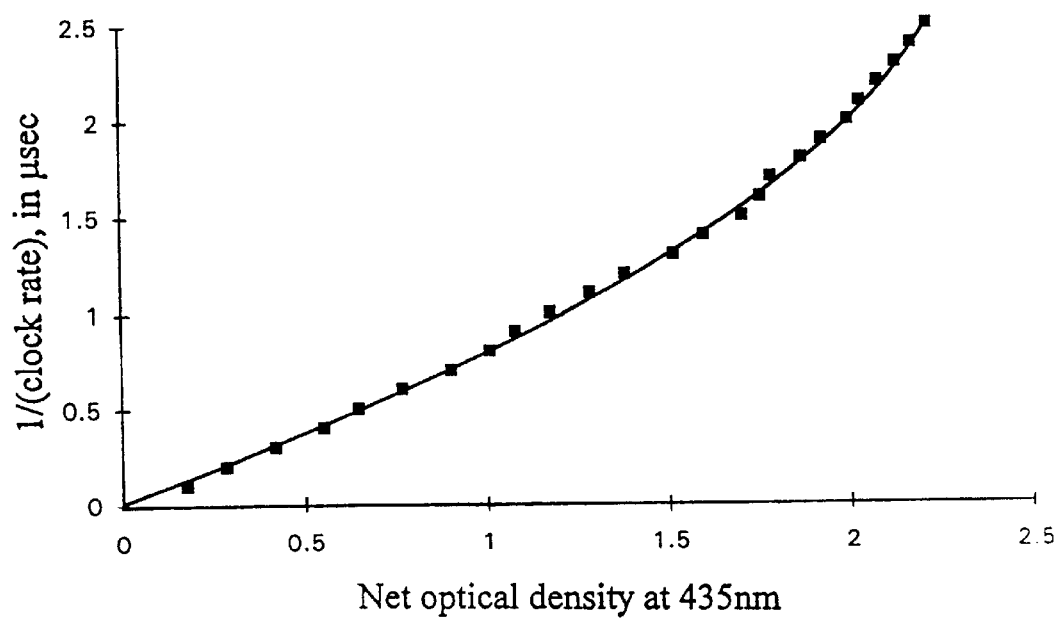
FIG. 18 records the calibration curve "1/(clock rate) versus net optical density at 435 nm" of e-beam exposure at 30 kv using Cambridge EBMF 10.5 e-beam writer with 75 na beam current and 0.2 μm addressing grid size.

FIG. 18 displays the calibration curve "1/(clock rate) versus net optical density at 435 nm" for the e-beam write scheme of 30 kv, 75 na beam current and 0.2 $\mu$m addressing grid size. Eq. B is the best fit polynomial equation of the data points of FIG. 18.

HEBS-glass masks having gray levels ranging from just a few to many hundreds were fabricated via e-beam direct write in HEBS-glass. For example, a very high quality, sinusoidal absorption grating 2 cm×2 cm in size having 625 gray levels within each period of 250 $\mu$m±0.2 $\mu$m was fabricated using Cambridge EBMF 10.5 e-beam writer. The grating is a series of linear strips, 2 cm long whose absorbance varies sinusoidally along the direction perpendicular to the strips. The linear strip which is the lines of constant optical density, has a requirement of better than ±0.1 $\mu$m in linearity. Within each period, the minimum transmission at the wavelength of 435 nm is 1% of the maximum transmission. 625 clock rates were determined from the eq. A for the grating fabricated using the write scheme of Table 1. A different set of 625 clock rates were determined from eq. B for a second grating fabricated using a second set of write parameters. The minimum and the maximum optical density values of the 625 gray levels are 0.172 and 2.172 using the write scheme of FIG. 17, and are 0.178 and 2.178 using the write parameters of FIG. 18.

Using a gray level mask in an optical exposure system, the throughput of resist exposure in DOE fabrication increases with a lower value of the minimum optical density level in the gray level mask. It is therefore desirable to have the optical density value of the lowest gray level being about or below 0.1.

A vector scan e-beam writer having the capability of higher clock rates can be employed to increase the throughput of mask making and also to reduce the minimum optical density value toward zero. The capability of focusing a larger beam current to a given e-beam spot size is an important feature to take full advantage of a larger clock rate.

It has been determined that the sensitivity of HEBS-glass is enhanced by the heat effect of a larger beam current. The throughput of writing a HEBS-glass gray level mask increases by a factor of 7.5 instead of 4 when the addressing grid size is increased from 0.2 $\mu$m to 0.4 $\mu$m, and at the same time the beam current is increased from 75 na to 300 na.

A grounding layer in the form of a 10 nm (or thicker) chrome layer should be applied to the HEBS-glass photomask blank. The only purpose of this thermally evaporated layer is to avoid local charging of the mask plate during the e-beam writing process. The mask is then exposed in the e-beam writer.

After the e-beam exposure the only necessary processing step is the wet etching of the Cr grounding layer to make the mask ready for exposure in an optical lithography exposure tool. Besides the removal of the grounding layer no processing of the mask is necessary.

Microscope Observation

Phase levels of DOE are immediately visible as gray levels in HEBS-glass upon e-beam exposure. The pattern data or image should be observed in a transmission mode. Since the pattern data or image in HEBS-glass do not scatter or reflect light, they are essentially not visible in a reflection mode.

DOE Made of An E-Beam Direct-Write HEBS-Glass Plate or Made of a Laser Beam Direct-Write LDW-Glass Plate The multi-gray levels in HEBS-glass were transformed into multi-phase levels, i.e., depth variation of surface relief in HEBS-glass upon a wet chemical etching or a dry etching process. An exemplary etching process consists of dipping an e-beam patterned HEBS-glass plate in 1.25% HF solution for 40 minutes. Before the etching process the image in HEBS-glass causes an absorption or amplitude modulation of an incoming light beam, whereas after the etching process the image in HEBS-glass effects a phase modulation of the incoming light beam.

Under microscope observation, the e-beam written pattern is essentially not visible in a reflection mode. After the selective etching process the pattern becomes visible in the reflection mode.

HEBS-glasses having been uniformly darkened with a high energy beam, electron beam in particular, is a laser beam direct write glass, LDW glass herein after.

The laser beam direct write LDW-glass has a much superior selective etch ratio than the e-beam direct write HEBS-glass. Due to a very large etch ratio of the laser exposed area vs. unexposed area within a LDW-glass mask, DOE as well as refractive micro lens arrays and general three dimensional surfaces can be fabricated in LDW-glass with the laser direct write approach to result in a LDW-glass mask and followed by an etching step.

LDW-Glass Mask Fabrication

One of the products of the present invention is an LDW-glass which is a HEBS-glass having been uniformly darkened to a predetermined optical density value. Said predetermined optical density value is at least the maximum optical density value of a pre-designed gray scale mask with multi-gray levels, said LDW-glass prior to being darkened with an electron beam or a flood electron gun is a transparent HEBS-glass which in bodies of 0.090 inch cross section will exhibit the following properties:

(a) the transmittance is more than 88% at 436 nm
(b) upon exposure to an electron beam with a flood electron gun or with an electron beam pattern generator operated at a value of acceleration voltage selected from 20 to 30 kV, the electron beam darkening sensitivity in the linear portion of the sensitivity curve, is at least 2.454 unit of optical density value in the spectral range of 365 nm to 630 nm per milli coulomb/cm$^2$.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$, said gray scale mask is made by exposure to a focused laser beam, said multi-gray levels are made using laser write speed and/or laser beam intensity and/or number of retraces as variable write parameters.

Another products of the present invention is an LDW-glass which is a HEBS-glass having been uniformly darkened to a predetermined optical density value, said predetermined optical density value is at least the maximum optical density value of a pre-designed gray scale mask with multi-gray levels, said LDW-glass prior to being darkened with an electron beam or a flood electron gun is a transparent HEBS-glass which in bodies of 0.090 inch cross section will exhibit the following properties:

(a) the transmittance is more than 88% at 436 nm
(b) upon exposure to an electron beam with a flood electron gun or with an electron beam pattern generator operated at a value of acceleration voltage selected from 10 to 100 kV, the HEBS-glass is darkened to a predetermined optical density value which is at least the maximum optical density value of a pre-designed gray scale mask with multi-gray levels.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$, said gray scale mask is made by exposure to a focused laser beam, said multi-gray levels are made using laser write speed and/or laser beam intensity and/or number of retraces as a variable write parameters.

The LDW-glass gray scale mask can be utilized in making three dimensional microstructures with general three dimensional surfaces in photoresist through a single optical exposure in a photolithographic process.

The profile of a three dimensional surface in photoresist is transferred into a substrate material using an etching process.

Laser Direct Write glass (LDW-glass) also offers the advantages of a one step fabrication of a true gray level mask. The exposure of this gray level mask is done in a laser writing tool. This also allows the use of the existing software previously written to support mask making and direct write on resist approaches for the fabrication of diffractive optical elements (DOEs). The so generated gray level mask can be used in an optical lithographic exposure tool (e.g., a G-line or a I-line wafer stepper, or a contact aligner) to mass fabricate resist profiles.

Using the LDW gray level mask fabrication and a following optical lithographic exposure, alignment errors are avoided, since the mask is written in a single step using different energy densities of a laser beam to generate multi-gray levels. This new approach also allows a very economical mask fabrication. Instead of fabricating a set of 5 binary chrome masks with all the involved resist processing and wet etching, a single writing step without the need for any processing is needed. This single mask then contains all the necessary information previously contained in a set of 5 binary masks. Misalignment due to sequential printing of 5 binary masks in a set is completely avoided. After the LDW gray level mask is fabricated a series of single exposure in a step-and-repeat system can generate hundreds of DOEs on the same wafer. This wafer can then be processed with a single CAIBE step to transfer the DOE structure of a large number of different elements simultaneously into the substrate. Since the complete DOE structure is transferred into the substrate there is no need for a resist stripping step after the etching process. After dicing the wafer hundreds of monolithic multilevel DOEs can be generated by a process which cut the involved processing steps by more than a factor of 5.

Figure 19:
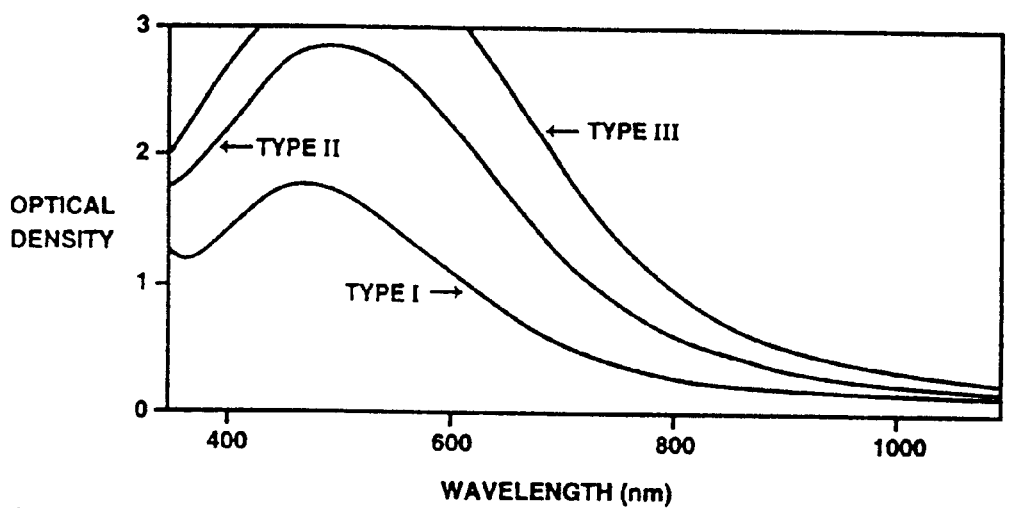
FIG. 19 depicts absorption spectra of LDW-HR plates-Type I, -Type II and -Type III.
Figure 20:
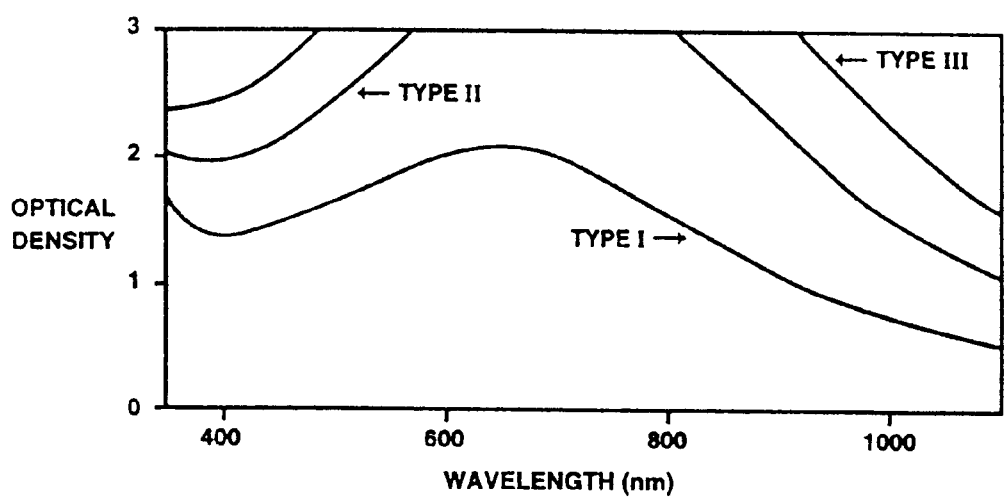
FIG. 20 depicts absorption spectra of LDW-IR plates-Type I, -Type II and -Type III.

The optical density spectra of exemplary LDW-glasses are shown in FIG. 19 and FIG. 20. FIG. 19 exhibits the optical density spectra of LDW-HR plates-Type I, -Type II and -Type III. FIG. 20 exhibits the optical density spectra of LDW-IR plates-Type I, -Type II and -Type III. LDW-HR plates-Type I, -Type II and -Type III as well as LDW-IR plates-Type I, -Type II and -Type III are HEBS-glass No. 3 having been darkened with flood electron gun, using the acceleration voltage and electron dosage of the electron beam exposure as variable parameters.

LDW-glass photomask blanks are monolithic silicate glass plates with no coating of any kind. LDW-glasses contain a large number density of coloring specks of silver within 1 μm in the thickness dimension into the glass surface. A focused laser beam of any wavelength in the spectral range of near uv, visible (e.g., 514 nm. 632 mm and 647 nm), near infrared (e.g. 820 nm and 1060 nm) and infrared (e.g. 10.6 μm) can be used to heat erase these coloring specks, causing a portion or all of the coloring specks of silver in glass to become colorless silver ions. The transmittance of LDW-glass plates increases with increasing writing-energy density of a focused laser beam. The required writing energy density is a function of the wavelength of write beam, writing velocity, i.e., the speed of laser sweep, the intensity profile of the focused laser beam and the value of %T at the desired gray level. For example, having been exposed to an energy density of 2 joule/cm² a write beam at the wavelength of 514 nm and a writing velocity of 4 meters/sec, LDW-HR plate-type I becomes totally transparent.

At any given writing velocity, there exists an erasure-threshold-intensity $I_{ETh}$ below which there is no change in optical density of LDW-glass plates even with multiple retraces. Using a write-beam intensity above the erasure-threshold-intensity $I_{ETh}$, the optical density of LDW-glass plates reduces with each additional retrace and the LDW-glass plates can be erased to a transparent state with multiple retraces. As the write-beam intensity increases further above the erasure-threshold-intensity $I_{ETh}$, retraces needed to bring about the transparent state decrease in number. LDW-glass plates are made transparent in one laser sweep i.e., no retraces at a full-erasure-intensity $I_{FE}$.

At any given writing velocity, there also exists an abrasion-threshold-intensity $I_{ATh}$ at and above which the LDW-glass plates are abraded or damaged on the glass surface due to excessive temperature (>800° C.) at the laser focused spot. However, the abrasion is not a pure thermal effect, since the abrasion-threshold-intensity $I_{ATh}$ is lower using a write beam of a shorter wavelength.

At a given writing velocity, the write-latitude is defined as the difference $I_{ATh}-I_{FE}$ between the abrasion-threshold-intensity and the full-erasure-intensity. The write-latitude increases with decreasing writing velocity and also increases with a write-beam of a longer wavelength.

At a writing velocity of 1 to 4 meter/sec the required writing energy density for fill erasure; is 2 to 4 joule/cm² using a write-beam whose wavelength in the spectral range of 488 nm to 1060 nm, provided the optical density of the LDW-glass plate is in excess of about 0.5 at the wavelength of the write-beam.

The values of the writing energy density cited are based on experimental data using write-beams having a Gaussian intensity profile at the focused laser spot. One can expect the required writing energy density to reduce by a factor of more than 2 and the write-latitudes increases, when a flat top intensity profile is utilized.

Multigray levels were written in LDW-glass plates using the writing velocity or laser beam intensity or multiple retraces or a combination thereof as variable parameters.

A LDW-glass photomask with multi-gray levels is ideally suited for fabrication of diffractive optical elements (DOE), Micro-electro-mechanical (MEM) devices, Micro-Opto-electro-mechanical (MOEM) devices. A mask for 32 phase levels of DOE is made by exposing in a laser beam writer with predetermined energy density levels according to a depth versus optical density calibration curve.

To transfer a multilevel resist structure of DOE into quartz through a dry etching process, the relative etch rate between photoresist and quartz substrate can be so chosen to achieve the final needed etch depth 3 to 6 times that in the resist. Therefore for the fabrication of DOE in quartz a surface height variation of 1 μm in the resist results in a depth modulation in quartz of up to 6 μm.

The optical density at the wavelength of optical lithographic exposure tool, e.g., 436 nm (G line of mercury arc) is 1.4, 2.4 and 3.0 for LDW-HR plates type I, type II and type III respectively. The corresponding optical density at 365 nm (I line) is 1.0, 1.6 and 2.0 for type I, type II and type III plates respectively. The optical density at 405 nm (H line) is 1.2, 2.0 and 2.7 for type I, type II and type III plates respectively. The optical density of type III plates exceeds 3.0 in the spectral range of 430 nm to 615 nm. Depending on the photoresist, and its thickness requirement, one can select among type I, type II and type III of LDW-HR plates for the required optical density at the wavelength of lithographic exposure tool. LDW-HR plates having optical density of any specified value that is the same or different from those of type I, type II and type III plates are fabricated by controlling the variable parameters in the darkening process using a high energy beam. The increased optical density values from type I to type II to type III plates are due primarily to an increased thickness of the colored glass layer.

LDW-HR plate-type I has a larger write-latitude than the type II plate which in turn has a better write-latitude than the type III plate.

LDW-HR plates are recommended for write-wavelengths shorter than about 900 nm and is also good for a write beam using $CO_2$ laser at 10.6 μm wavelength. For write-wavelengths longer than about 750 nm, LDW-IR plates are preferred.

The optical density values at the wavelength of optical lithographic exposure tool, e.g. 436 nm are 1.2, 1.8 and 2.6 for LDW-IR plates type I, type II and type III respectively. The corresponding optical density values at 365 nm are 1.4, 1.8 and 2.1 for type I, type II and type III plates respectively. The optical density values at 405 nm are 1.2, 1.8 and 2.4 for type I, type II and type III plates, respectively. The optical density of type II plates exceeds 3.0 in the spectral range of 570 nm to 805 nm. The optical density of type III plates exceeds 3.0 in the spectral range of 490 nm to 915 nm. Depending on the wavelength of a laser writer and on the photoresist thickness requirement, one can select among type I, type II and type III of LDW-IR plates. LDW-IR plates having optical density values that are the same or different from those of type I, type II and type III plates are fabricated by controlling the variable parameters in the darkening process using a high energy beam. The increased optical density values from type I to type II to type III plates are due primarily to an increased thickness of the colored glass layer.

The type I plate has a larger write latitude than type II plate which in turn has a better write-latitude than the type III plate.

Due to the effect of the erasure-threshold intensity, there is little or no soft line-edges in the laser direct write patterns recorded in LDW-glass plates using a focused laser beam with a Gaussian intensity profile. The recorded spot size in LDW-glass plates is substantially smaller than the size of the airy disc of the focused laser spot in air. Moreover, the grain size of coloring specks of silver in the LDW-glass is of atomic dimension, and LDW-glass plates have no graininess. Submicron features were recorded in LDW-glass plates using laser beams of various visible wavelengths focused with an objective lens which has a numerical aperture as low as 0.25.

Absorption-Phase-Shift Mask

A binary absorption HEBS-glass mask becomes a binary phase-shift mask upon a selective wet chemical etching or a dry etching process. Starting with a HEBS-glass blank having an e-beam sensitized glass layer which is sufficiently thick so that the binary phase-shift mask is still sensitive to e-beam, a second e-beam exposure produces an absorption-phase-shift mask.

Advantages of Direct Write All-Glass Photomasks

Direct write all-glass photomask blanks includes HEBS-glass photomask blanks and LDW-glass photomask blanks.

Direct write on HEBS-glasses or LDW-glasses create instant photomasks, and eliminate chrome and photoresist, and their associated processing chemicals. This is a zero-waste, inexpensive solution for mask making. By employing the all-glass photomask blanks, photomasks meeting specifications containing the most stringent defect levels can be prepared consistently. Advantages gained in using all-glass photomask blanks include the following:

1. Photomasks can be patterned from all-glass blanks without a number of processing steps.
2. The advantages that can be expected from eliminating the post exposure processing steps include faster turnaround, better line width control and much lower defect densities.
3. Defects such as intrusion, extrusion, lack of adhesion, excess material/chrome spots and scratches in chrome are eliminated due to the elimination of chrome and resist as well as the associated processing steps.
4. No post exposure process-induced CD variation. No process induced image quality problems (e.g., line distortion) due to resist swelling during baking.
5. The direct write all-glass photomasks are non-reflective, and have near zero difference in reflectivity between darkened and undarkened areas. Reflectivity is 4% which is much less than that of the anti-reflective chrome at all wavelengths.
6. White light is a safe light for the all-glass photomask blanks enabling inspection of the mask-blanks with intense white light before, during, and after the pattern is generated.
7. The all-glass mask is more durable than a chrome mask since the all-glass mask is less sensitive to surface scratching due to its volume effect, i.e., the masking pattern is within the glass surface rather than on the surface.
8. For contact printing, the all-glass masks have long life times and more wafers produced per mask.
9. The sensitivity of an all-glass blank is very uniform throughout the whole blank surface. Therefore, good CD control is not limited to the center of the mask. In contrast, chrome blanks often have the non-uniform photoresist coating thickness near the edges of the chrome plate.
10. Easy re-inspection of accepted masks; since there exists no scattered light from a clean all-glass photomask (without the chrome features which scatter light in the image plane), defects such as dust particles, fingerprints, and scratches are readily observable/detected in the passage of an intense light beam in a dark room. No expensive inspection equipment are needed to re-inspect used masks, or could-be contaminated masks.
11. Unlike chrome blanks, there is no chemical waste problems.

Applications of the Direct Write All-glass Photomask Blanks

Surfaces with three dimensional structures are required in several fields of micro technology. Structures with sawtooth profile (blaze) increases the efficiency of DOE. Tapered structures offer more flexibility in the design of microelectronics and micro mechanical components. Examples of 3D shaping using HEBS-glass gray level masks and/or LDW-glass gray level masks are:

1. Tapered structures for microelectronics, e.g. tapered structures in thick polyimide to realize electrical connection between two metallic layers separated by the thick polyimide,
2. Micro optical devices such as diffractive and refractive micro lenses. bifocal intraocular lenses, widely asymmetric DOE, miniature compact disc heads anti reflective surface, complex imaging optics, grating couples, polarization-sensitive beam splitters, spectral filters, wavelength division multiplexers, elements for head-up and helmet mounted display, for focal plane optical concentration and optical efficiency enhancement, for color separation, beam shaping, and for miniature optical scanners, microlens arrays, diffraction gratings, laser diode array collimators and correctors, aberration correction, hybrid optics, microprism arrays, micromirror arrays and Bragg gratings.
3. Integrated optical components, two dimensional fanout gratings, optical interconnect, signal switching, fiber pig tailing, DOE to couple light from a laser into a fiber,
4. Micro-electro-mechanical (MEM) devises for sensors and actuators in automotive, machine tools, robotics and medical instrumentation, also devices for applications in micro valves, inertial micro sensors, micro machined RF switches, GPS component miniaturization, and a host of other sensors and actuators for applications to space, air, land, and sea vehicles, as well as industrial, biotechnology and future consumer electronics,
5. Micro-opto-electro-mechanical (MOEM) devices such as laser scanners, optical shutters, dynamic micro mirrors, optical choppers and optical switches.

What is claimed is:

1. A method of fabricating a surface with a three dimensional structure in a photo resist layer coated on a substrate comprising:

exposing a High Energy Beam Sensitive glass (HEBS-glass) plate to an electron beam (e-beam) in a vector scan e-beam writer to provide a gray scale pattern of varying optical density in the HEBS-glass plate to form a HEBS-glass grey level mask having multiple levels of optical density, each of said multiple levels of optical density in the HEBS-glass mask being written with a clock rate corresponding to a predetermined optical density value, the clock rate being determined from the predetermined optical density value using a selected calibration curve of the HEBS glass plate which is optical density versus clock rate, said calibration curve of the HEBS glass plate having been determined for a number of variable parameters which include glass composition of the HEBS glass plate and write parameters of the e-beam writer, the write parameters being beam acceleration voltage, beam current and addressing grid size;

using the HEBS-glass gray level mask having multiple levels of optical density in an optical lithography tool to expose the photo resist layer coated on the substrate, to produce a certain resist thickness after development of the photo resist layer from each optical density level in the HEBS-glass mask and to produce the surface with the three dimensional structure in the photo resist layer in response to exposure with the gray scale pattern in the HEBS-glass plate; and determining the predetermined optical density value which corresponds to a designed resist thickness of the photo resist layer having the surface with a designed three dimensional structure from the designed resist thickness using a calibration curve of an analog transfer scheme which relates resist thickness versus optical density, said calibration curve of the analog transfer scheme having been determined experimentally for a selected photo resist used in the photo resist layer.

2. The method according to claim 1 wherein the selected photo resist is Shipley S1650 photo resist.

3. The method according to claim 1 wherein the calibration curve of the HEBS glass plate, optical density versus clock rate, is derived from an e-beam darkening sensitivity curve of the HEBS-glass plate which is optical density versus electron dosage using the formula $$D(\text{microcoulomb/cm}^2) = I * N / f$$

which relates the clock rate to electron dosage, where D is electron dosage in microcoulomb/cm$^2$, I is the beam current in ampere, f is the clock rate, 1/f is e-beam dwell time per pixel in microsecond, and N is the number of pixels in 1 cm$^2$ and a pixel is an addressing grid size.

4. The method according to claim 3 wherein the glass composition and the write parameters of the e-beam writer are so chosen that the selected calibration curve of the HEBS-glass plate corresponding to an electron beam darkening sensitivity curve of the HEBS glass plate selected from the group consisting of Equation No. 1 to Equation No. 40; wherein Equation No. 1 is: $y=19708x^6-7787x^5+6181.2x^4-1063.8x^3+85.688x^2+3.3806x$;

Equation No. 2 is $y=-15440x^6+12082x^5-3761.5x^4+555.15x^3-40.414x^2+10.637x$;

Equation No. 3 is $y=46062x^6-38146x^5+12229x^4-2013.9x^3+173.69x^2-5.8097x$;

Equation No. 4 is $y=51961x^6-43905x^5+14402x^4-2361.2x^3+197.27x^2+2.2436x$;

Equation No. 5 is $y=4788.8x^6-4881.1x^5+1822.8x^4-308.43x^3+19.251x^2+4.098x$;

Equation No. 6 is $y=3780.7x^6-4395.5x^5+1959x^4-421.14x^3+40.268x^2+4.882x$;

Equation No. 7 is $y=4227.3x^6-4897.4x^5+2192.6x^4-490.42x^3+50.025x^2+6.8341x$;

Equation No. 8 is $y=3750.9x^6-4226.7x^5+1854.8x^4-408.5x^3+41.902x^2+4.8131x$;

Equation No. 9 is $y=-355.78x^6+466.62x^5-243.17x^4+62.851x^3-12.485x^2+5.5571x$;

Equation No. 10 is $y=-692.18x^6+804.39x^5-358.96x^4+75.143x^3-10.535x^2+6.9982x$;

Equation No. 11 is $y=-175.37x^6+38.823x^5+112.01x^4-80.56x^3+14.073x^2+7.6867x$;

Equation No. 12 is $y=-839.24x^6+947.64x^5-359.07x^4+40.139x^3-0.7855x^2+6.4234x$;

Equation No. 13 is $y=-664.62x^6+932.44x^5-464.2x^4+95.04x^3-13.314x^2+6.4665x$;

Equation No. 14 is $y=-900.79x^6+1480.9x^5-905.98x^4+243.25x^3-32.801x^2+9.8528x$;

Equation No. 15 is $y=-1283.3x^6+1929.4x^5-1020x^4+210.47x^3-22.431x^2+12.109x$;

Equation No. 16 is $y=111.03x^6-345.7x^5+352.69x^4-158.9x^3+24.867x^2+6.7982x$;

Equation No. 17 is $y=-104.68x^6+149.86x^5-51.158x^4-8.925x^3-0.3208x^2+5.866x$;

Equation No. 18 is $y=-341.18x^6+643.91x^5-430.4x^4+115.13x^3-16.314x^2+9.1502x$;

Equation No. 19 is $y=-237.51x^6+304.15x^5-52.05x^4-65.071x^3+15.235x^2+10.164x$;

Equation No. 20 is $y=225.42x^6-507.45x^5+442.41x^4-182.81x^3+27.586x^2+6.9154x$;

Equation No. 21 is $y=1165x^6-1729.1x^5+969.72x^4-255.38x^3+28.215x^2+1.9949x$;

Equation No. 22 is $y=321.26x^6-495.79x^5+299.53x^4-93.047x^3+11.878x^2+3.99x$;

Equation No. 23 is $y=530.82x^6-893.24x^5+604.38x^4-205.16x^3-28.195x^2+4.3652x$;

Equation No. 24 is $y=747.21x^6-1197.4x^5+741.5x^4-217.47x^3+24.784x^2+2.8845x$;

Equation No. 25 is $y=-454.78x^6+748.41x^5-467.28x^4+137.8x^3-22.463x^2+4.8643x$;

Equation No. 26 is $y=-399.43x^6+659.66x^5-409.6x^4+113.52x^3-15.916x^2+5.6722x$;

Equation No. 27 is $y=-46.317x^6-22.298x^5+112.29x^4-77.504x^3+13.876x^2+5.0038x$;

Equation No. 28 is $y=417.51x^6-711.04x^5+469.27x^4-145.5x^3+16.454x^2+3.218x$;

Equation No. 29 is $y=-74.993x^6+118.24x^5-57.174x^4+5.2492x^3-0.6172x^2+3.3699x$;

Equation No. 30 is $y=-278.14x^6+503.66x^5-329.14x^4+89.552x^3-11.422x^2+5.4742x$;

Equation No. 31 is $y=3.461x^6-102.55x^5+172.08x^4-102.48x^3+18.951x^2+4.8104x$;

Equation No. 32 is $y=161.84x^6-348.51x^5+286.3x^4-107.41x^3+13.817x^2+3.2921x$;

Equation No. 33 is $y=7.7262x^6-37.019x^5+56.546x^4-35.995x^3+6.9532x^2+2.7738x$;

Equation No. 34 is $y=45.959x^6-160.56x^5+213.4x^4-135.08x^3+37.556x^2+0.3871x$;

Equation No. 35 is $y=82.35x^6-237.03x^5+259.77x^4-130.11x^3+23.171x^2+4.6292x$;

Equation No. 36 is $y=138.78x^6-316.52x^5+272.92x^4-106.53x^3+14.299x^2+3.2743x$;

Equation No. 37 is $y=-257.78x^6+493.22x^5-357.35x^4+125.26x^3-24.07x^2+4.2726x$;

Equation No. 38 is $y=-421.26x^6+736.88x^5-503.36x^4+168.42x^3-30.486x^2+5.7851x$;

Equation No. 39 is $y=55.321x^6-40.121x^5-7.75x^4+13.643x^3-8.1316x^2+5.4291x$;

Equation No. 40 is $y=-199.22x^6+369.63x^5-264.28x^4+94.119x^3-20.554x^2+4.7848x$;

wherein x is electron dosage in millicoulomb/cm$^2$; y is optical density.

5. The method according to claim 1 wherein the glass composition is selected from the group consisting of glass No. 1 to No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$; 1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_2$; 4.3% $Li_2O$; 7.8% $Na_2O$; 4.2% $K_2O$; 6.1% $TiO_2$; 1.5% $Al_2O_3$; 11.0% ZnO; 2.0% $B_2O_3$; and 3.0% Cl;

GLASS No. 14 is 60.5% $SiO_2$; 5.1% $Li_2O$; 8.1% $Na_2O$; 4.3% $K_2O$; 10.2% $TiO_2$; 1.2% $Al_2O_3$; 7.1% ZnO; 0.5% $B_2O_3$; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; and 3.0% Cl;

GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl;

GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

6. The method according to claim 3 wherein the glass composition and the write parameters of the e-beam writer are so chosen that the selected calibration curve of the HEBS-glass plate corresponding to an e-beam darkening sensitivity curve of the HEBS-glass plate which has a linear portion and the slope of the linear portion of the sensitivity curve is at least 2.454 units of optical density value in the spectral range of 365 nm to 630 nm per electron dosage unit of millicoulomb/cm$^2$.

7. The method according to claim 1 wherein the write parameters are 20 kV for the beam acceleration voltage, 0.1 micrometer for the addressing grid size, and 25 na for the beam current.

8. The method according to claim 1 wherein the write parameters are 30 kV for the beam acceleration voltage, 0.4 micrometer for the addressing grid size and 250 na for the beam current.

9. The method according to claim 1 further comprising coating the HEBS-glass plate with a grounding layer to avoid local charging of the glass plate during the e-beam writing process.

10. The method according to claim 9 wherein the grounding layer is in the form of a 10 nm chrome (Cr) layer.

11. The method according to claim 10 wherein the Cr grounding layer is removed from the HEBS-glass mask after e-beam exposure by wet etching to make the mask ready for exposure in an optical lithography exposure tool.

12. The method according to claim 1 wherein the three dimensional structure is selected from the group consisting of diffractive optical elements (DOE), refractive micro-optics, micro-electro-mechanical (MEMS) devices, micro-opto-electro-mechanical (MOEM) devices, integrated optical components and beam shaping optics.

13. A method of fabricating a surface with a three dimensional structure in a photo resist layer coated on a substrate comprising:

exposing a High Energy Beam Sensitive glass (HEBS-glass) plate to an electron beam (e-beam) in a raster scan e-beam writer to provide a gray scale pattern of varying optical density in the HEBS-glass plate to form a HEBS-glass gray level mask having multiple levels of optical density, each of said multiple levels of optical density in the HEBS-glass mask being written with a certain number of scan counts corresponding to a predetermined optical density value, the number of scan counts being determined from the predetermined optical density value using a selected calibration curve of the HEBS glass plate which is optical density versus number of scan counts, said calibration curve of the HEBS-glass plate having been determined for a number of variable parameters which include glass composition of the HEBS glass plate and write parameters of the e-beam writer, the write parameters being beam acceleration voltage, beam current and addressing grid size;

using the HEBS-glass gray level mask having multiple levels of optical density in an optical lithography tool to expose the photo resist layer coated on the substrate to produce a certain resist thickness after development of the photo resist layer from each optical density level in the HEBS-glass mask and to produce the surface with the three dimensional structure in the photo resist layer in response to exposure with the gray scale pattern in the HEBS-glass plate; and determining the predetermined optical density value which corresponds to a designed resist thickness of the photo resist layer having the surface with a designed three dimensional structure from the designed resist thickness using a calibration curve of an analog transfer scheme which is resist thickness versus optical density, said calibration curve of the analog transfer scheme having been determined experimentally for a selected photo resist used in the photo resist layer.

14. The method according to claim 13 wherein the raster scan e-beam writer is a MEBES e-beam pattern generator.

15. The method according to claim 13 wherein the write parameters are 20 kV for the beam acceleration voltage, 0.5 micrometer for the addressing grid size, and 4000 na for the beam current.

16. A method of fabricating a surface with a three dimensional structure from a substrate coated with a photo resist layer comprising:

exposing a High Energy Beam Sensitive glass (HEBS-glass) plate to an electron beam (e-beam) in a vector scan e-beam writer to provide a gray scale pattern of varying optical density in the HEBS-glass plate to form a HEBS-glass gray level mask having multiple levels of optical densities, each of said multiple levels of optical densities in the HEBS-glass mask being written with a clock rate corresponding to a predetermined optical density value, the clock rate being determined from the predetermined optical density value using a selected calibration curve of the HEBS glass plate which is optical density versus clock rate, said calibration curve of the HEBS-glass plate having been determined for a number of variable parameters which include glass composition of the HEBS glass plate and write parameters of the e-beam writer, the write parameters being beam acceleration voltage, beam current and addressing grid size;

the HEBS-glass gray level mask having multiple levels of optical densities being used in an optical lithography tool to expose the photo resist layer coated on the substrate to produce a certain resist thickness after development of the photo resist layer from each optical density level in the HEBS-glass mask and to produce a resist surface profile in the photo resist layer in response to exposure with the gray scale pattern in the HEBS-glass plate, the predetermined optical density value which corresponds to a designed resist thickness of the photo resist layer having a designed resist surface profile being determined from the designed resist thickness using a calibration curve of an analog transfer scheme which is resist thickness versus optical density, said calibration curve of the analog transfer scheme having been determined experimentally for a selected photo resist used in the photo layer, the gray scale pattern corresponding to the resist surface profile in the photo resist layer; and transferring the resist surface profile in the photo resist layer onto the surface of the substrate by a dry etching process to produce the surface with the three dimensional structure in the substrate.

17. The method according to claim 16 wherein glass composition is selected from the group consisting of glass No. 1 to glass No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$; 1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_2$; 4.3% $Li_2O$; 7.8% $Na_2O$; 4.2% $K_2O$; 6.1% $TiO_2$; 1.5% $Al_2O_3$; 11.0% ZnO; 2.0% $B_2O_3$; and 3.0% Cl;

GLASS No. 14 is 60.5% $SiO_2$; 5.1% $Li_2O$; 8.1% $Na_2O$; 4.3% $K_2O$; 10.2% $TiO_2$; 1.2% $Al_2O_3$; 7.1% ZnO; 0.5% $B_2O_3$; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; and 3.0%

GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl;

GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

18. The method according to claim 16 wherein the three dimensional structure is selected from the group consisting of diffractive optical elements (DOE), refractive micro-optics, micro-electro-mechanical (MEMS) devices, micro-opto-electro-mechanical (MOEM) devices, integrated optical components and beam shaping optics.

19. A method of fabricating a surface with a three dimensional structure from a substrate coated with a photo resist layer comprising:

exposing a High Energy Beam Sensitive glass (HEBS-glass) plate to an electron beam (e-beam) in a raster scan e-beam writer to provide a gray scale pattern of varying optical density in the HEBS-glass plate to form a HEBS-glass gray level mask having multiple levels of optical density, each of said multiple levels of optical density in the HEBS-glass mask being written with a certain number of scan counts corresponding to a predetermined optical density value, the number of scan counts being determined from the predetermined optical density value using a selected calibration curve of the HEBS glass plate which is optical density versus number of scan counts, said calibration curve of the HEBS-glass plate having been determined experimentally for a number of variable parameters which include glass composition of the HEBS glass plate and write parameters of the e-beam writer, the write parameters being beam acceleration voltage, beam current and addressing grid size;

the HEBS-glass gray level mask having multiple levels of optical density being used in an optical lithography tool to expose the photo resist layer coated on the substrate to produce a certain resist thickness after development of the photo resist layer from each optical density level in the HEBS-glass mask and to produce a resist surface profile in the photo resist layer in response to exposure with the gray scale pattern in the HEBS-glass plate, the predetermined optical density value which corresponds to a designated resist thickness of the photo resist layer having a designed resist surface profile being determined from the designed resist thickness using a calibration curve of an analog transfer scheme which is resist thickness versus optical density, said calibration curve of the analog transfer scheme having been determined experimentally for a selected photo resist used in the photo resist layer, the gray scale pattern corresponding to the resist surface profile in the photo resist layer; and transferring the resist surface profile in the photo resist layer onto the surface of the substrate by a dry etching process to produce the surface with the three dimensional structure in the substrate.

20. A method of fabricating a HEBS-glass gray level mask having a designed gray scale pattern of varying optical density comprising:

exposing a High Energy Beam Sensitive glass (HEBS-glass) plate to an electron beam (e-beam) in a raster scan e-beam writer to provide the designed gray scale pattern of varying optical density in the HEBS-glass plate to produce the HEBS-glass gray level mask, the HEBS-glass gray level mask having multiple levels of optical density, each of said multiple levels of optical density in the HEBS-glass mask being written with a certain number of scan counts corresponding to a predetermined optical density value in the designed gray scale pattern, the number of scan counts being determined from the predetermined optical density value using a selected calibration curve of the HEBS glass plate which is optical density versus number of scan counts, said calibration curve of the HEBS glass plate having been determined experimentally for a number of variable parameters which include glass composition of the HEBS glass plate and write parameters of the e-beam writer, the write parameters being beam acceleration voltage, beam current and addressing grid size.

21. The method according to claim 20 wherein the raster scan e-beam writer is a MEBES e-beam pattern generator.

22. The method according to claim 20 wherein the glass composition is selected from the group consisting of glass No. 1 to glass No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$; 1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_{2;\ 4.3}$% $Li_2O$; 7.8% $Na_2O$; 4.2% $K_2O$; 6.1% $TiO_2$; 1.5% $Al_2O_3$; 11.0% ZnO; 2.0% $B_2O_3$; and 3.0% Cl;

GLASS No. 14 is 60.5% $SiO_2$; 5.1% $Li_2O$; 8.1% $Na_2O$; 4.3% $K_2O$; 10.2% $TiO_2$; 1.2% $Al_2O_3$; 7.1% ZnO; 0.5% $B_2O_3$; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; and 3.0% C GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl;

GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

23. A method of fabricating a HEBS-glass gray level mask having a designed gray scale pattern of varying optical density comprising:

exposing a High Energy Beam Sensitive glass (HEBS-glass) plate to an electron beam (e-beam) in a vector scan e-beam writer to provide the designed gray scale pattern of varying optical density in the HEBS glass plate to produce the HEBS glass gray level mask, the HEBS glass gray level mask having multiple levels of optical density, each of said multiple levels of optical density in the HEBS-glass mask being written with a clock rate corresponding to a predetermined optical density value in the designed gray scale pattern, the clock rate being determined from the predetermined optical density value using a selected calibration curve of the HEBS glass plate which is optical density versus clock rate, said calibration curve of the HEBS-glass plate having been determined experimentally for a number of variable parameters which include glass composition of the HEBS glass plate and write parameters of the e-beam writer, the write parameters being beam acceleration voltage, beam current and addressing grid size.

24. The method according to claim 23 wherein the calibration curve of the HEBS glass plate, optical density versus clock rate, is derived from an e-beam darkening sensitivity curve of the HEBS-glass plate which is optical density versus electron dosage using the formula $$D(\text{microcoulomb/cm}^2) = I * N/f$$

which relates the clock rate to electron dosage, where D is electron dosage in microcoulomb/cm$^2$, I is the beam current in ampere, f is the clock rate, 1/f is e-beam dwell time per pixel in microsecond, and N is the number of pixels in 1 cm$^2$ and a pixel is an addressing grid size.

25. The method according to claim 24 wherein the glass composition and the write parameters of the e-beam writer are so chosen that the selected calibration curve of the HEBS-glass plate corresponding to an electron beam darkening sensitivity curve of the HEBS glass plate selected from the group consisting of Equation No. 1 to Equation No. 40; wherein Equation No. 1 is: $y=19708x^6-17787x^5+6181.2x^4-1063.8x^3+85.688x^2+3.3806x$;

Equation No. 2 is $y=-15440x^6+12082x^5-3761.5x^4+555.15x^3-40.414x^2+10.637x$;

Equation No. 3 is $y=46062x^6-38146x^5+12229x^4-2013.9x^3+173.69x^2-5.8097x$;

Equation No. 4 is $y=51961x^6-43905x^5+14402x^4-2361.2x^3+197.27x^2+2.2436x$;

Equation No. 5 is $y=4788.8x^6-4881.1x^5+1822.8x^4-308.43x^3+19.251x^2+4.098x$;

Equation No. 6 is $y=3780.7x^6-4395.5x^5+1959x^4-421.14x^3+40.268x^2+4.882x$;

Equation No. 7 is $y=4227.3x^6-4897.4x^5+2192.6x^4-490.42x^3+50.025x^2+6.8341x$;

Equation No. 8 is $y=3750.9x^6-4226.7x^5+1854.8x^4-408.5x^3+41.902x^2+4.8131x$;

Equation No. 9 is $y=-355.78x^6+466.62x^5-243.17x^4+62.851x^3-12.485x^2+5.5571x$;

Equation No. 10 is $y=-692.18x^6+804.39x^5-358.96x^4+75.143x^3-10.535x^2+6.9982x$;

Equation No. 11 is $y=-175.37x^6+38.823x^5+112.01x^4-80.56x^3+14.073x^2+7.6867x$;

Equation No. 12 is $y=-839.24x^6+947.64x^5-359.07x^4+40.139x^3-0.7855x^2+6.4234x$;

Equation No. 13 is $y=-664.62x^6+932.44x^5-464.2x^4+95.04x^3-13.314x^2+6.4665x$;

Equation No. 14 is $y=-900.79x^6+1480.9x^5-905.98x^4+243.25x^3-32.801x^2+9.8528x$;

Equation No. 15 is $y=-1283.3x^6+1929.4x^5-1020x^4+210.47x^3-22.431x^2+12.109x$;

Equation No. 16 is $y=111.03x^6-345.7x^5+352.69x^4-158.9x^3+24.867x^2+6.7982x$;

Equation No. 17 is $y=-104.68x^6+149.86x^5-51.158x^4-8.925x^3-0.3208x^2+5.866x$;

Equation No. 18 is $y=-341.18x^6+643.91x^5-430.4x^4+115.13x^3-16.314x^2+9.1502x$;

Equation No. 19 is $y=-237.51x^6+304.15x^5-52.05x^4-65.071x^3+15.235x^2+10.164x$;

Equation No. 20 is $y=225.42x^6-507.45x^5+442.41x^4-182.81x^3+27.586x^2+6.9154x$;

Equation No. 21 is $y=1165x^6-1729.1x^5+969.72x^4-255.38x^3+28.215x^2+1.9949x$;

Equation No. 22 is $y=321.26x^6-495.79x^5+299.53x^4-93.047x^3+11.878x^2+3.99x$;

Equation No. 23 is $y=530.82x^6-893.24x^5+604.38x^4-205.16x^3-28.195x^2+4.3652x$;

Equation No. 24 is $y=747.21x^6-1197.4x^5+741.5x^4-217.47x^3+24.784x^2+2.8845x$;

Equation No. 25 is $y=-454.78x^6+748.41x^5-467.28x^4+137.8x^3-22.463x^2+4.8643x$;

Equation No. 26 is $y=-399.43x^6+659.66x^5-409.6x^4+113.52x^3-15.916x^2+5.6722x$;

Equation No. 27 is $y=-46.317x^6-22.298x^5+112.29x^4-77.504x^3+13.876x^2+5.0038x$;

Equation No. 28 is $y=417.51x^6-711.04x^5+469.27x^4-145.5x^3+16.454x^2+3.218x$;

Equation No. 29 is $y=-74.993x^6+118.24x^5-57.174x^4+5.2492x^3-0.6172x^2+3.3699x$;

Equation No. 30 is $y=-278.14x^6+503.66x^5-329.14x^4+89.552x^3-11.422x^2+5.4742x$;

Equation No. 31 is $y=3.461x^6 \ 102.55x^5+172.08x^4-102.48x^3+18.951x^2+4.8104x$;

Equation No. 32 is $y=161.84x^6-348.51x^5+286.3x^4-107.41x^3+13.817x^2+3.2921x$;

Equation No. 33 is $y=7.7262x^6 37.019x^5+56.546x^4-35.995x^3+6.9532x^2+2.7738x$;

Equation No. 34 is $y=45.959x^6-160.56x^5+213.4x^4-135.08x^3+37.556x^2+0.3871x$;

Equation No. 35 is $y=82.35x^6 237.03x^5+259.77x^4-130.11x^3+23.171x^2+4.6292x$;

Equation No. 36 is $y=138.78x^6-316.52x^5+272.92x^4-106.53x^3+14.299x^2+3.2743x$;

Equation No. 37 is $y=-257.78x^6+493.22x^5-357.35x^4+125.26x^3-24.07x^2+4.2726x$;

Equation No. 38 is $y=-421.26x^6+736.88x^5-503.36x^4+168.42x^3-30.486x^2+5.7851x$;

Equation No. 39 is $y=55.321x^6-40.12x^5-7.75x^4+13.643x^3-8.1316x^2+5.4291x$;

Equation No. 40 is $y=-199.22x^6+369.63x^5-264.28x^4+94.119x^3-20.554x^2+4.7848x$;

wherein x is electron dosage in millicoulomb/cm$^2$; y is optical density.

26. The method according to claim 23 wherein the glass composition is selected from the group consisting of glass No. 1 to glass No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$; 1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_2$; 4.3% $Li_2O$; 7.8% $Na_2O$; 4.2% $K_2O$; 6.1% $TiO_2$; 1.5% $Al_2O_3$; 11.0% ZnO; 2.0% $B_2O_3$; and 3.0% Cl;

GLASS No. 14 is 60.5% $SiO_2$; 5.1% $Li_2O$; 8.1% $Na_2O$; 4.3% $K_2O$; 10.2% $TiO_2$; 1.2% $Al_2O_3$; 7.1% ZnO; 0.5% $B_2O_3$; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; and 3.0% Cl;

GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl;

GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

27. The method according to claim 24 wherein the glass composition and the write parameters of the e-beam writer are so chosen that the selected calibration curve of the HEBS-glass plate corresponding to an e-beam darkening sensitivity curve of the HEBS-glass plate which has a linear portion and the slope of the linear portion of the sensitivity curve is at least 2.454 units of optical density value in the spectral range of 365 nm to 630 nm per electron dosage unit of millicoulomb/$cm^2$.

28. The method according to claim 23 wherein the HEBS-glass plate having an ion-exchanged surface glass layer which is produced within the surface of a base glass plate through ion exchanging the base glass plate of a base glass composition in an acidic aqueous solution containing soluble ionic silver, the base glass composition comprising silica, metal oxides, halides and photoinhibitors.

29. The method according to claim 28 wherein the base glass composition consisting essentially of, on the mole % oxide basis, 11.4 to 17.5% of one or more alkali metal oxide; 2.4 to 10.2% of at least one of photosensitivity inhibitors and RS suppressing agents selected from the group consisting of TiO2, Ta2O5, ZrO2, Nb2O5, La2O3, Y2O3, and WO3 with at least 2.4% TiO2; 1.1 to 2.4% Al2O3; 0 to 4.6% B2O3; 3.7 to 13.2% ZnO; 0.5 to 6% Cl; and 58.2 to 78.8% SiO2.

30. A method of fabricating a LDW-glass gray level mask comprising:

darkening at least a portion of a High Energy Beam Sensitive-glass (HEBS-glass) plate with an electron beam to form a Laser Direct Write-glass (LDW-glass) plate having a uniformly darkened portion having a uniform optical density; and exposing a plurality of areas on the uniformly darkened portion of the LDW-glass plate with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

31. The method according to claim 30 wherein the HEBS-glass plate having an ion-exchanged surface glass layer which is produced within the surface of a base glass plate through ion exchanging the base glass plate of a base glass composition in an acidic aqueous solution containing soluble ionic silver, the base glass composition comprising silica, metal oxides, halides and photoinhibitors.

32. The method according to claim 31 wherein the base glass composition consisting essentially of, on the mole % oxide basis, 11.4 to 17.5% of one or more alkali metal oxide; 2.4 to 10.2% of at least one of photosensitivity inhibitors and RS suppressing agents selected from the group consisting of TiO2, Ta2O5, ZrO2, Nb2O5, La2O3, Y2O3, and WO3 with at least 2.4% TiO2; 1.1 to 2.4% Al2O3; 0 to 4.6% B2O3; 3.7 to 13.2% ZnO; 0.5 to 6% Cl; and 58.2 to 78.8% SiO2.

* * * * *